(12) United States Patent
Korcz et al.

(10) Patent No.: US 9,553,432 B2
(45) Date of Patent: Jan. 24, 2017

(54) PUSH-IN CABLE CONNECTOR AND ELECTRICAL BOX ASSEMBLY

(71) Applicant: Hubbell Incorporated, Shelton, CT (US)

(72) Inventors: Krzysztof W. Korcz, Grainger, IN (US); Steven J. Johnson, Buchanan, MI (US); Richard J. Wagner, South Bend, IN (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 14/971,425

(22) Filed: Dec. 16, 2015

(65) Prior Publication Data

US 2016/0105011 A1 Apr. 14, 2016

Related U.S. Application Data

(63) Continuation of application No. 14/209,482, filed on Mar. 13, 2014, now Pat. No. 9,247,662.

(60) Provisional application No. 61/787,962, filed on Mar. 15, 2013.

(51) Int. Cl.
| | |
|---|---|
| *H02G 15/10* | (2006.01) |
| *H02G 3/08* | (2006.01) |
| *H05K 5/02* | (2006.01) |
| *H02G 3/06* | (2006.01) |

(52) U.S. Cl.
CPC ............ *H02G 3/083* (2013.01); *H02G 3/0691* (2013.01); *H05K 5/0247* (2013.01)

(58) Field of Classification Search
USPC .......................................................... 174/50
See application file for complete search history.

(56) References Cited

U.S. PATENT DOCUMENTS

| | | | | |
|---|---|---|---|---|
| 2,444,092 A | * | 6/1948 | Clayton | H02G 3/0683 24/135 R |
| 2,708,122 A | * | 5/1955 | Clark | H02G 3/0683 285/154.3 |
| 3,006,661 A | * | 10/1961 | McNeill | H02G 3/0683 285/154.3 |

(Continued)

FOREIGN PATENT DOCUMENTS

CA 2788787 A1 3/2013

OTHER PUBLICATIONS

International Search Report and Written Opinion for PCT Application No. PCT/US2014/028031 dated Jul. 15, 2014 (9 pages).

*Primary Examiner* — Dhirubhai R Patel
(74) *Attorney, Agent, or Firm* — Michael Best & Friedrich, LLP

(57) ABSTRACT

A cable connector is provided for coupling to and mounted within the internal cavity of an electrical box for securing an electrical cable passing through an opening in the electrical box. The cable connector includes a body having a first end positioned next to or adjacent the cable opening in the electrical box and a second end spaced from the first end and the cable opening. At least one and typically two retaining members are spring biased from the first end of the body and extend into a cable passage of the body toward the second end. A front wall is provided at the second end of the body with an opening for receiving the wires and forming a stop member to prevent the armor sheathing from passing through the front wall.

20 Claims, 15 Drawing Sheets

(56) References Cited

U.S. PATENT DOCUMENTS

| | | | | |
|---|---|---|---|---|
| 4,277,641 | A | * | 7/1981 | Bauer .................... H02G 3/083 |
| | | | | 174/661 |
| 4,316,999 | A | * | 2/1982 | Nattel .................... H02G 3/085 |
| | | | | 174/661 |
| 4,619,332 | A | * | 10/1986 | Sheehan .............. H02G 3/0691 |
| | | | | 174/659 |
| 4,724,282 | A | * | 2/1988 | Troder ................... H02G 3/083 |
| | | | | 174/661 |
| 4,922,057 | A | * | 5/1990 | Ross ...................... H02G 3/083 |
| | | | | 174/661 |
| 5,013,872 | A | | 5/1991 | Lockwood et al. |
| 5,831,213 | A | | 11/1998 | Wright et al. |
| 6,064,009 | A | | 5/2000 | Jorgensen et al. |
| 7,476,817 | B1 | | 1/2009 | Shemtov |
| 7,582,829 | B2 | | 9/2009 | Yan |
| 9,252,578 | B2 | | 2/2016 | Korcz et al. |
| 2007/0079983 | A1 | | 4/2007 | Pyron |
| 2008/0128164 | A1 | | 6/2008 | Johnson |
| 2012/0024596 | A1 | | 2/2012 | DiLillo et al. |

\* cited by examiner

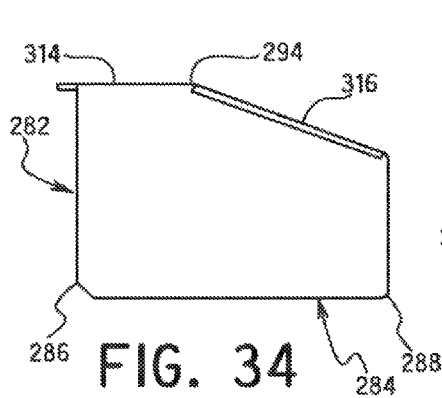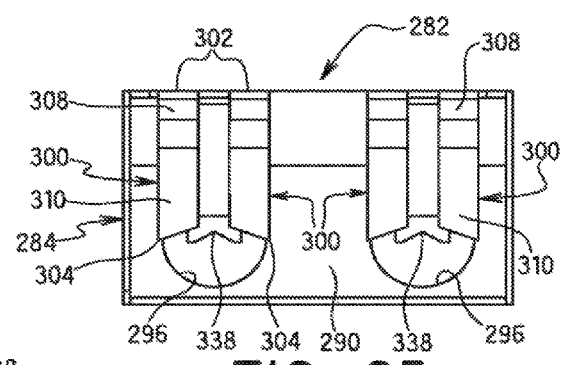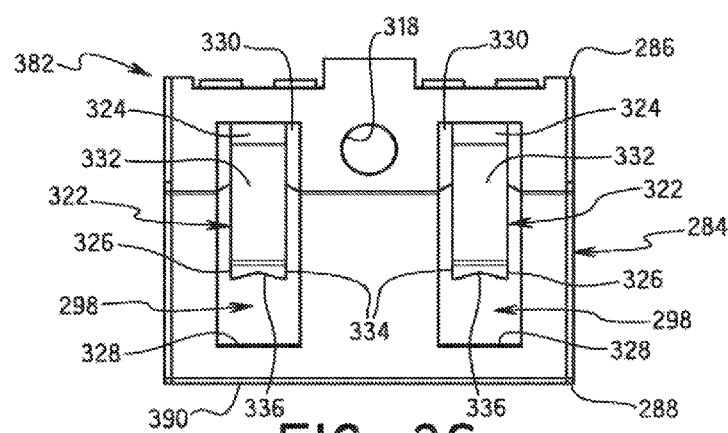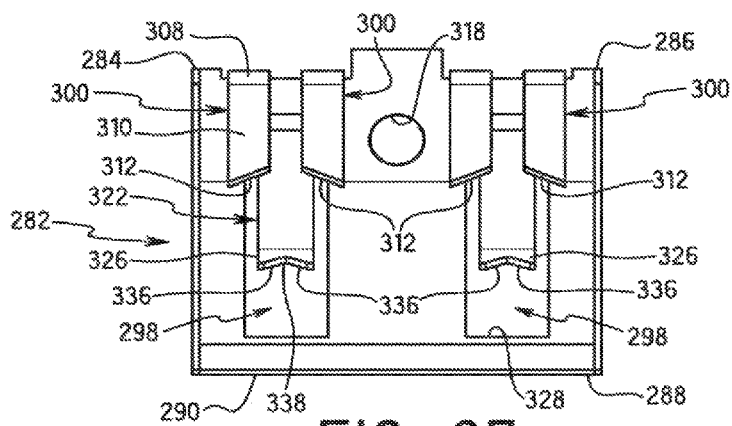

PUSH-IN CABLE CONNECTOR AND ELECTRICAL BOX ASSEMBLY

CROSS-REFERENCE TO RELATED APPLICATIONS

This application is a continuation of U.S. patent application Ser. No. 14/209,482, filed Mar. 13, 2014, now U.S. Pat. No. 9,247,662, which claims the benefit of U.S. Provisional Application Ser. No. 61/787,962 filed Mar. 15, 2013. The entire contents of both of these documents are hereby incorporated by reference.

FIELD

The present invention is directed to a cable connector and to an electrical box assembly having a cable connector for securing a cable to the box. The invention is particularly directed to an electrical box having a cable connector where the connector provides a sliding and snap-in connection for the electrical cable and particularly for metal clad and armor cables.

BACKGROUND

Electrical cables are commonly supplied to an electrical junction box for connecting the cable to electrical fixtures or other electrical cables. The cables generally pass through an opening in the wall of the electrical box and are secured in place by a suitable claim. Conventional cable clamps generally clamp the cable between the clamping plate and a side wall or bottom wall of the electrical box. This type of clamping arrangement generally relies on the smooth surface of the wall of the electrical box that does not adequately grip the cable.

Cable clamps are produced which are able to accommodate metal armor cable and plastic sheath cables. These devices include a stop member for the metal sheath to prevent the metal sheath from extending into the electrical box. Various clamping devices are known for clamping the electrical cable. Many of these cable clamps are mounted to the cable and then inserted into the opening in the electrical box so that at least a portion of the clamp projects outwardly from the outer surface of the electrical box.

One example of an electrical cable clamp is disclosed in U.S. Pat. No. 4,316,999 to Nattel which discloses an electrical wiring box and cable clamp where the cable clamp is attached to the wall of the electrical box. The cable clamp is a flexible member that overlies the opening in the electrical box bottom edge of the leg portions including upwardly turned flanges. The bottom wall of the electrical box includes ridges or score lines for engaging the nonmetallic cable.

U.S. Pat. No. 4,922,057 to Ross discloses an electrical box having a flexible flat retaining member attached to the inner face of the side wall of the electrical box. As shown in FIG. 2, the flat retaining member flexes to grip the surface of the cable passing through the opening in the electrical box.

U.S. Pat. No. 4,724,282 to Trader discloses a nonmetallic electrical box having a flexible metal cable retaining member attached to the inner face of the electrical box. The retaining member flexes when the cable is passed through the opening to grip the cable.

U.S. Pat. No. 4,277,641 to Bauer et al. discloses a nonmetallic electrical box having a cable clamp member that is inserted into the cavity of the electrical box. The cable clamp member includes an outer frame and a flexible flap. The flexible flaps bend upon insertion of the electrical cable through the opening in the frame to grip the cable.

U.S. Patent Publication No. 2012/0024596 to DiLillo et al. discloses a plastic cable clamp adapted for mounting in one of the openings in the electrical box. The cable clamp includes one or more flexible members capable of clamping the nonmetallic cable. In one embodiment, the cable clamp includes flexible legs that can bend inwardly upon insertion of the cable to grip the outer surface of the cable.

While the prior cable clamps and connectors are generally suitable for the intended use, there is a continuing need in the industry for improved cable clamps and connectors.

SUMMARY

The electrical box assembly of the invention is a one piece construction having a cable connector permanently attached to the electrical box for gripping the outer surface of non-metallic sheathed cables, metal clad cables, and armor cables. The cable connector is coupled to a rear wall or side wall of the electrical box without extending through the cable opening in the electrical box.

The invention is particularly directed to a cable connector fixed to an electrical box to form an electrical box assembly. The cable connector is positioned entirely within the walls of the electrical box. The cable connector is aligned with the cable opening in the electrical box to receive the electrical cable. The cable connector has a front wall with an opening for the cable and a cable retainer that is spring biased inwardly toward the cable passage to engage the cable.

The features of the invention are provided by a cable retainer coupled to a side wall of the electrical box and a front wall coupled to the rear wall of the electrical box and spaced from the cable retainer. The front wall includes apertures for receiving the electrical wires from at least one cable passing through a cable opening in the sidewall. The cable retainer is positioned to cover at least a portion of the cable opening in the side wall of the electrical box so that the cable retainer flexes inwardly when the cable is passed through the cable opening. The cable retainer has at least one flexible leg having a top edge fixed to the sidewall of the electrical box and a bottom edge aligned with the cable opening of the electrical box. The flexible leg bends away from the side wall of the electrical box when the cable is inserted into the cable connector. In one embodiment, the cable retainer includes two superimposed legs having different lengths with a bottom edge of the legs are positioned in the cable opening. The different lengths of the legs enable the cable retainer to grip two different size cables.

The present invention is directed to a cable connector and to an electrical box assembly having a cable connector for connecting and gripping a cable passing through an opening in an electrical box. The cable connector in the various embodiments of the invention have a body with a first end positioned next to the opening in the electrical box and a second end opposite the first end and spaced from the opening in the electrical box. The body has a cable passage extending between the first end and the second end for receiving the electrical cable. A front wall is provided at the second end and has an opening for receiving the electrical wires from the cable. At least one and preferably at least two cable retainers extend from the first end of the body into the cable passage and toward the second end of the body for gripping the cable.

The various features of the invention are provided by an electrical box assembly comprising an electrical box having a rear wall and a side wall with an opening having a dimension for receiving an electrical cable. The cable connector is coupled to the electrical box and is aligned with the opening in the side wall of the electrical box to define a cable passage. In one embodiment the cable connector has a first cable retainer extending away from the side wall of the electrical box into the cable passage and a second cable retainer extending away from the side wall of the electrical box into the cable passage. The first retainer and the second retainer converge toward the axial center of the cable passage and are spaced apart a distance to grip the outer surface of the electrical cable between the ends of the cable retainer.

In one embodiment, the cable connector includes opposite side walls where each sidewall has a cable retainer integrally formed therewith. The cable retainers are coupled to a first end of the respective side wall by a U-shaped portion so that a free end of each cable retainer extends toward the front wall and the retainers converge toward each other to grip opposite sides of the cable.

Another feature of the invention is to provide a cable connector having two cable retainers to grip opposite sides of the cable and a leg positioned between the cable retainers to engage a top surface of the cable. The leg can be coupled to a rear wall of the cable connector or to a top wall of the cable connector.

The features of the invention are further attained by providing an electrical box assembly comprising an electrical box having a rear wall and a side wall with a cable opening having a dimension for receiving an electrical cable. A cable connector having a cable passage is fixed to the electrical box and is aligned with the opening in the side wall. The cable connector has a body with a first end for positioning adjacent to the opening in the electrical box and a second end opposite the first end. A front wall at the second end of the body has an opening for receiving the electrical cable. The opening has a dimension to receive a standard nonmetallic sheathed cable with a plurality of conductors and has a dimension so that the front wall abuts the metal sheath of a standard metal sheath cable with a plurality of conductors to allow the conductors of the cable to pass through the opening and prevent the metal sheath from passing through the opening. A first cable retainer has a first end at the first end of the body and a second free end extending toward the front wall. The free end of the first cable retainer extends toward the front wall and towards an axis of the cable passage for gripping a cable and capturing the cable between the second free end and the rear wall of the electrical box. A first leg extends away from the side wall into the cable passage, and a second leg extends away from the side wall into the cable passage and converges with the first leg to grip an outer surface of the cable.

The features of the invention are also attained by providing an electrical cable clamp comprising a body having a first side wall with a first end and a first leg extending inwardly with respect to an inner cable passage. A second side wall is spaced from the first side wall to form the inner cable passage between the side walls. The second side wall has a first end with a second leg extending inwardly with respect to the inner cable passage. A front wall extends between the first side wall and second side wall. The front wall has a central opening with a dimension for receiving the cable.

The features of the invention are still further attained by providing an electrical box assembly comprising an electrical box with an opening for receiving an electrical cable. A cable connector is fixed to the electrical box and has an inner passage for receiving the electrical cable. The cable connector includes a first side having a first end next to the side wall of the electrical box. A first leg extends from the first end of the first wall and extends away from the side wall of the electrical box. A second side wall is spaced from the first side wall to define the inner cable passage. The second side wall has a first end at the opening of the electrical box and a second leg extending from the second end and spaced from the first leg a distance to grip the outer surface of the electrical cable.

Other objects, advantages and salient features of the invention will become apparent from the following detailed description which, taken in conjunction with the annexed drawings, discloses various embodiments of the invention.

BRIEF DESCRIPTION OF THE DRAWINGS

The following is a brief description of the drawings in which;

FIG. 34 is a side view of the cable connector of FIG. 32;
FIG. 35 is a rear view of the cable connector of FIG. 32;
FIG. 36 is a top view of the cable connector of FIG. 32;
FIG. 37 is a bottom view of the cable connector of FIG. 32.

DETAILED DESCRIPTION

Figure 1:
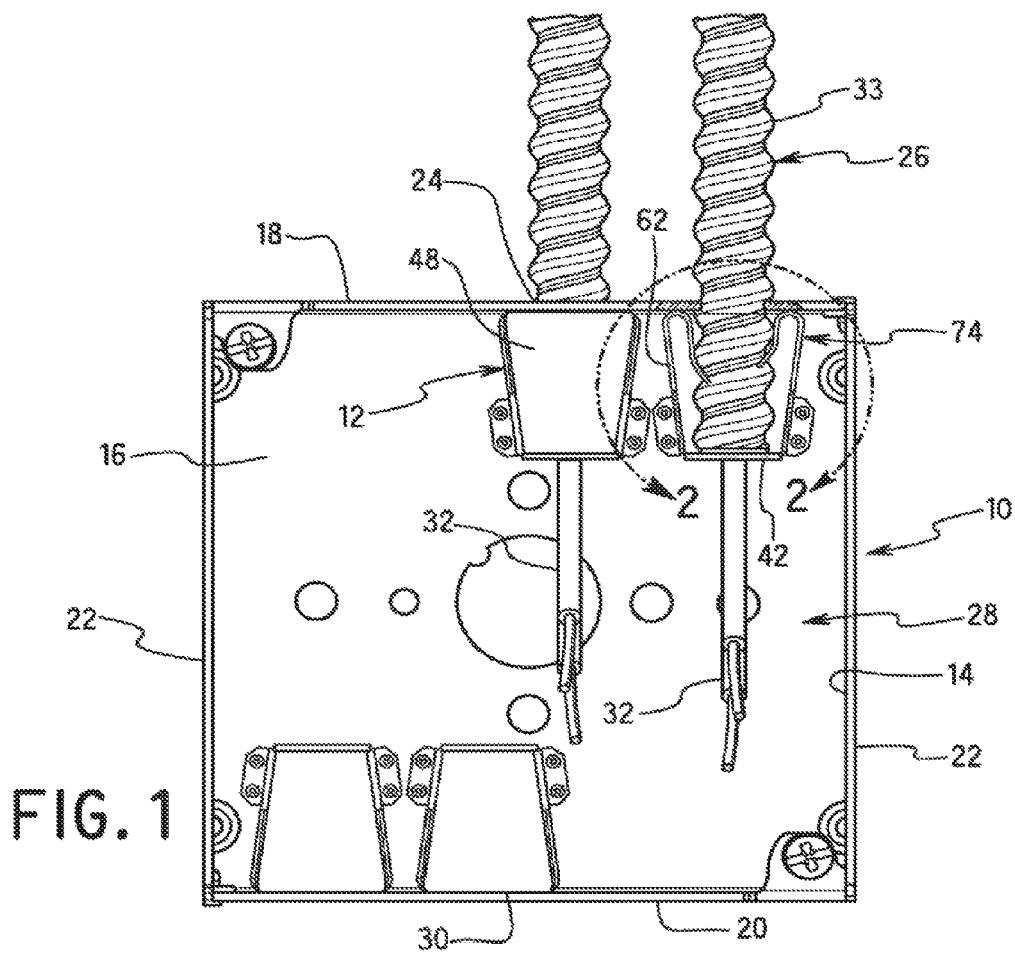
FIG. 1 is top view of the electrical box in one embodiment of the invention showing the cable connector in cross section.

The invention is directed to a cable connector and to an electrical box assembly that includes an electrical box and a cable connector for non-metallic sheathed cables, metal clad and armor cables. The cable connector of the invention avoids the use of separate connectors that are often required for coupling metal clad, armor and non-metallic cables to an electrical box. Electrical codes require the use of some form of connector for securing the cables to the electrical box.

The invention in one embodiment is directed to a preassembled electrical box assembly that has a cable connector as a fixed part on the electrical box to avoid the need for separate connectors or handling of separate connectors. The cable connector of the invention is attached to the electrical box in a pre-assembled form for use by an electrician without the need to install the cable connectors on the job site. In one embodiment, the cable connector is fixed to the electrical box by welding, screws, coupling tabs, or other means for attaching the cable connector to the box during the manufacture of the electrical box. In one embodiment, the cable connector is permanently fixed to the electrical box at the time of manufacture.

In one embodiment of the invention shown in FIGS. 1-9, the electrical box 10 includes a cable connector 12 that is secured to a surface of the electrical box 10 to form the electrical box assembly. The electrical box 10 is typically made from steel by deep drawing, by cutting and bending from a blank or by joining cut pieces together to form the electrical box into the finished shape as known in the art. The cable connector 12 is sufficiently resilient to allow the cable to pass through the cable passage and grip the outer surface of the cable.

The electrical box 10 is constructed in a manner similar to a conventional electrical box by having an open front 14, a rear wall 16, and one or more side walls extending from the rear wall 16 to define the open front 14. In the embodiment shown, the electrical box 10 has a first side wall 18, and a second side wall 20 opposite the first side wall 18 and connecting walls 22 extending between the first side wall 18 and the second side wall 20. In the embodiment shown, the electrical box 12 has a substantially square shape although the electrical box can have any suitable dimension and shape. In other embodiments, the electrical box can be rectangular, hexagonal, round or other suitable shape.

In the embodiment shown, the first side wall 18 includes at least one and preferably two cable openings 24 extending through the wall for feeding the cable 26 to the interior cavity 28 of the box 10. In the embodiment shown, the two cable openings 24 are positioned next to or adjacent one side of the box. The second side wall 20 is also shown having two cable openings 30 positioned on an opposite side of the box so that the cable openings and the respective cables are staggered with respect to each other so as not to interfere with each other when fed into the electrical box. The electrical box can have any number of cable openings as known in the art.

The electrical box 10 and cable connector 12 are preferably preassembled as a single, one-piece, integral unit or assembly for installation by the electrician without the need for attaching separate connectors to the cable and/or the electrical box during installation. The invention is particularly suitable for use with non-metallic sheathed cables, metal clad cables, or armor cables 26 having internal electrically conducting wires 32. The metal clad cables as shown have a spiral wound corrugated metal sheathing 33 as known in the art.

The cable connector 12 can be attached permanently to the electrical box 10 at the time of manufacture in manner to prevent separation of the cable connector 12 from the box 10 during normal use. In the embodiments shown in the drawings, the cable connector 12 is attached by welding, riveting or other fastening means to the rear wall 16 of the electrical box 10 to align the cable connector 12 with the respective cable openings 24 and 30. In other embodiments, the cable connector 12 can be attached to one or more of the side walls so that the cable connectors are aligned with the cable opening 30 in the electrical box 10. Although the cable connector 12 is preferably fixed to the electrical box, the cable connector can be attached to the electrical box by a snap connection such as by a prong that snaps into an aperture in a wall of the electrical box.

The cable openings 24 are generally provided in the side walls although cable openings can also or alternatively be provided in the rear wall. In one embodiment of the invention, the cable connector 12 is attached to a suitable surface that is substantially perpendicular to the wall or surface with the cable opening.

Figure 2:
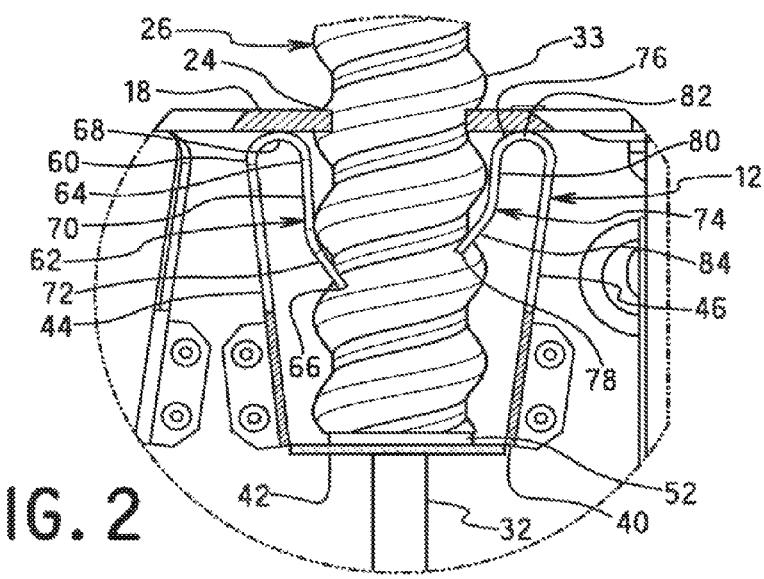
FIG. 2 is an enlarged partial top view in cross section of the cable connector of FIG. 1.
Figure 3:
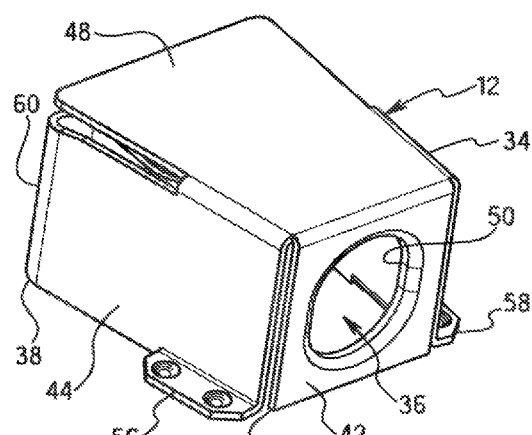
FIG. 3 is top perspective view of the cable connector before attaching to the electrical box.
Figure 4:
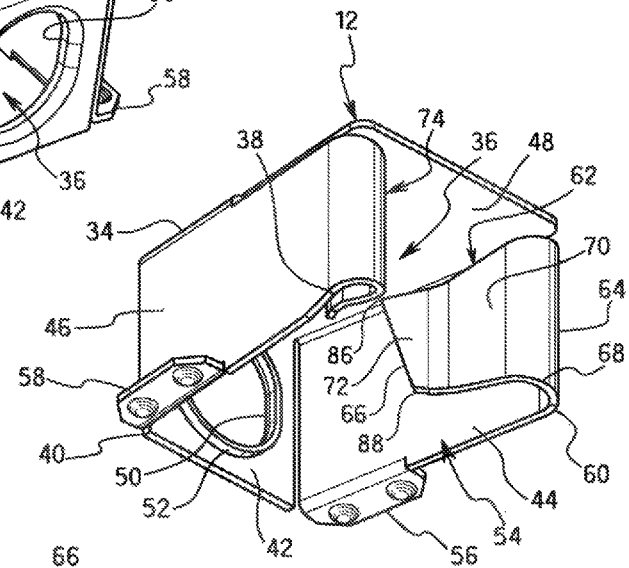
FIG. 4 is a bottom perspective side view of the cable connector taken along line 4-4 of FIG. 3.
Figure 5:
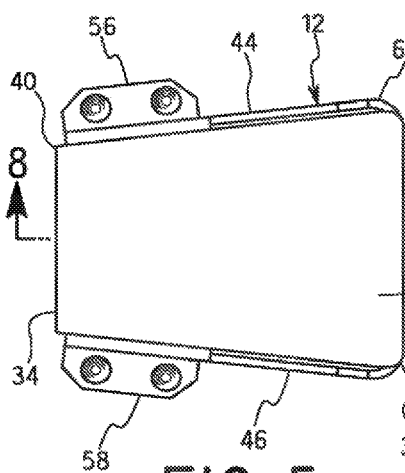
FIG. 5 is a top view of the cable connector.

Referring to FIGS. 1 and 2, the cable connector 12 is attached to the rear wall of the electrical box by welding. In further embodiments, the cable connector can be attached to the side wall or other surface so that the cable connector is permanently fixed to the electrical box in a position to be aligned with the cable access opening 30. Preferably the cable connector 12 is mounted entirely within the cavity of the electrical boxes so that no portion extends through the cable openings.

Referring to FIGS. 2-9 the cable connector 12 is preferably formed as a one piece, integral member formed of steel or other metal. The cable connector 12 is preferably formed from a blank metal sheet that is cut and folded into the final shape as shown. The cable connector 12 is formed by a body 34 having a cable passage 36 with a first end 38 and an opposite second end 40. A front wall 42 is provided at the second end 40 of the body. The first end 38 of the body 34 is positioned at the side wall of the electrical box and aligned with the cable opening 24. The second end 40 of the body is spaced from the first end 38 and the side wall 18 of the electrical box 10.

The body 34 of the cable connector 12 in the embodiment shown in FIGS. 1-9 has a first side wall 44 and an opposite second side wall 46. The first side wall 44 and the second side wall 46 are connected together by a top wall 48 extending between the side walls. In the embodiment shown, the front wall 42 is integrally formed with the top wall 48 and extends downwardly substantially perpendicular to the top wall 48. The front wall 42 has an opening 50 for receiving the electrical wires 32 and feeding the wires to the internal cavity of the electrical box 10. The opening 50 is formed with a rounded edge 52 to form a smooth collar to prevent damaging the wires passing through the opening 50.

In the embodiment shown, the opening 50 forms apertures that can have a circular shape or an oval shape that are dimensioned to accommodate electrical cables. The openings 50 have a dimension to allow the electrical wires to pass through the opening and a dimension to prevent standard metal armor cable from passing through. In this manner, the front wall 42 functions as a stop for the armor sheath as shown in FIGS. 1 and 2.

In the embodiment shown, the side walls 44 and 46 are inclined with respect to each other and slightly converge toward the front wall 42. In other embodiments, the side walls 44 and 46 can be substantially parallel to each other. The side walls 44 and 46, the top wall 48 and the front wall 42 define the longitudinal cable passage 36 that extends through the cable connector 12. The front wall 42 and the opening 50 define the second end 40 and outlet end of the cable connector 12. The opposite end defines the first end 38 of the body and an open inlet end for the cable 36 passing through the opening in the electrical box.

In the embodiment of FIGS. 1-9, the cable connector 12 has an open bottom 54. The cable connector 12 is attached to the wall of the electrical box to enclose the cable passage 36 by the side walls 44 and 46 and the top wall 48 of the cable connector 12 and the corresponding wall of the electrical box 12.

In the embodiment shown, the rear wall 16 of the electrical box mates with the open bottom 54 of the cable connector 12. The bottom edge of the first side wall 44 includes a mounting flange 56 extending substantially perpendicular to the respective side wall portion. The bottom edge of the second side wall 46 includes a mounting flange 58 extending substantially perpendicular to the respective side wall portion. The mounting flanges 56 and 58 are attached to the rear wall 16 of the electrical box to permanently fix the cable connector 12 to the electrical box. In the embodiment shown, the mounting flanges 56 and 58 have detents 56 for use in welding the mounting flanges to the rear wall 16. In other embodiments, the mounting flanges can be fixed to the rear wall 16 by rivets or other fasteners. In a further embodiment, the mounting flanges can be formed substantially parallel to the plane of the respective side wall and inserted through slots formed in the rear wall. The mounting flanges can then be bent and optionally welded to retain the tabs within the slots.

The open first end 38 of the body 34 of the electrical connector 12 has a dimension to receive the cable 26. As shown in FIG. 2, the first side wall 44 has a first edge 60 at the first end 38 with a cable retainer 62. A first end 64 of the cable retainer 62 coupled to the edge 60 of the side wall 44 and a second free end 66. The cable retainer 62 in the embodiment shown is in the form of a leg with the first end 64 integrally formed with the first side wall 44 forming a U-shaped connecting portion 68. The U-shaped connecting portion 68 forms a spring member to spring bias the retainer 62 toward the cable passage and to allow the retainer to bend and flex by insertion of the cable and to provide sufficient spring biasing force to grip the cable. The retainer 62 is bent inwardly toward the cable passage 36 and has a first leg section 70 extending toward the front wall 42 and a second leg section 72 bent inwardly towards the cable passage 36. The second leg section 72 has a terminal end forming the second free end 66 of the retainer 62 and is formed at an inclined angle with respect to the longitudinal dimension of the cable passage 36 and the plane of the first leg section 70. In the embodiment shown, the second free end 66 has a substantially straight edge that is angled with respect to the front wall 42. Alternatively, the free end 66 can have a concave shape corresponding to the shape of the outer surface and dimension of the cable 26. The free end 66 is formed at an angle corresponding substantially to the angle of the corrugations of the armor clad cable so that the terminal end is able to grip the recess between the corrugations as shown in FIG. 2.

The second side wall 46 also has a first edge with a cable retainer 74 integrally formed with the side wall. The cable retainer 74 has a first end 76 coupled to the first edge of the side wall 46 and a second free end 78. The retainer 74 also has a first leg section 80 coupled to the side wall 46 by a U-shaped connecting portion 82 and extends toward the front wall 42 at an inclined angle. The U-shaped connecting portion 82 define a spring member to spring bias the first leg section 80 toward the center of the connector and toward the first cable retainer 62 and enable the legs to bend and flex with respect to the side wall. A second leg section 84 extends inwardly from the first leg section 80 at an inclined angle with respect to the first leg section 80 towards the cable passage 36. The free end 78 of the retainer 74 is formed at an inclined angle opposite the inclined angle of the first leg section of the first retainer 62 to grip an opposite side of the armor cladding of the cable as shown in FIG. 2. The cable retainers 62 and 74 are oriented so that the free ends converge toward the axis of the cable passage to grip opposite sides of the cable.

Figure 6:
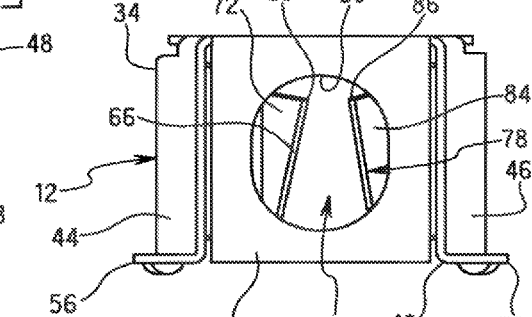
FIG. 6 is a front view of the cable connector.
Figure 7:
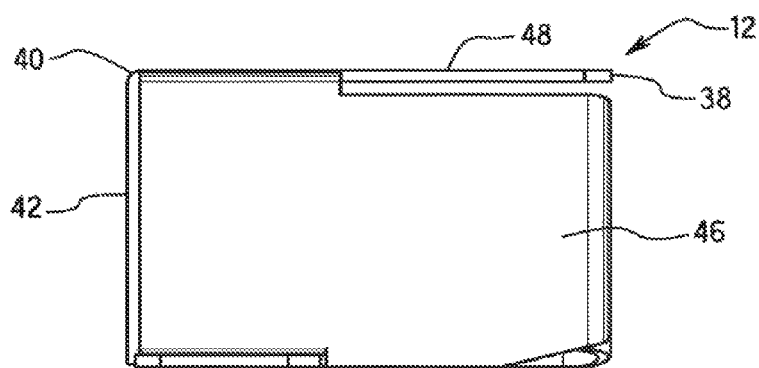
FIG. 7 is a side view of the cable connector.
Figure 8:
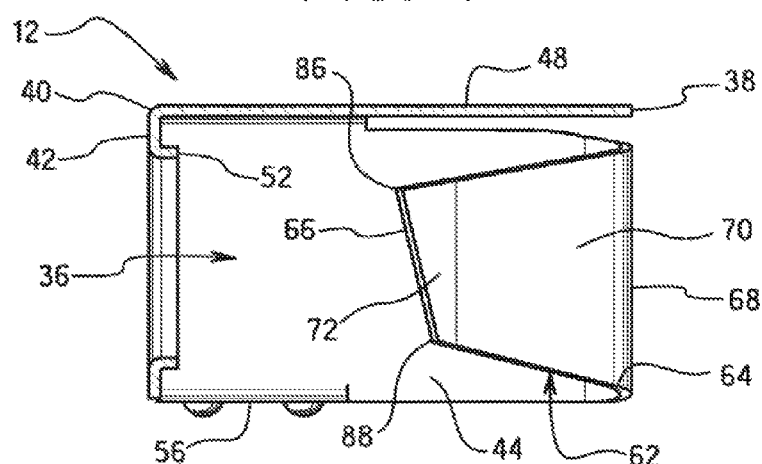
FIG. 8 is a cross sectional view of the cable connector.
Figure 9:
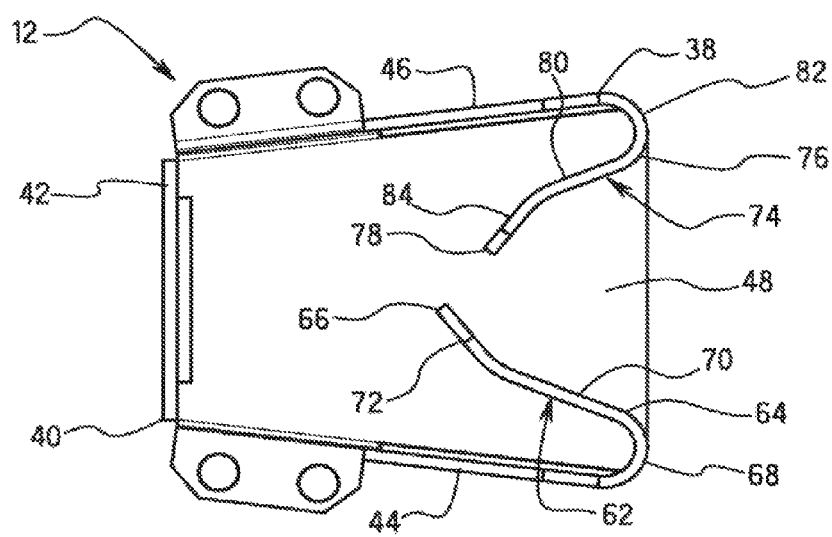
FIG. 9 is a bottom view of the cable connector.

As shown in FIGS. 2 and 9, the first retainer 62 has a longitudinal length slightly longer than the length of the second retainer 74 to effectively grip the spiraling corrugations of the electrical cable as shown in FIG. 2. As shown, the retainers 62 and 74 extend away from the cable opening in the electrical box into the cable passage 36 of the body 34 and are angled to allow the cable to be inserted through the opening in the electrical box and resist removal of the cable from the electrical box. The free ends 66 and 78 are angled with respect to the axis of the cable passage 36 so that the top corners 86 of the free ends project toward the front wall 42 as shown in FIG. 8 and converge toward each other relative to the bottom corner 88 as shown in FIG. 6. The angled free ends of the cable retainers form a V-shaped recess to engage an upper side surface of the armor cable so that the cable is captured between the rear wall 16 of the electrical box 10 and the edges defining the free ends of the cable retainers.

The cable connector 12 is preferably formed from steel or other metal having sufficient strength to effectively grip the cable while allowing the retainers sufficient resilience to allow the cables to be inserted and removed as necessary. The cable retainers 62 and 74 are formed from resilient spring steel and have sufficient resilience to deflect outwardly towards the respective side wall portion by insertion of the electrical cable while being spring biased toward each other for effectively gripping the outer surface of the cable.

In use, the cable connector 12 is attached to the electrical box as shown in FIG. 1. The cable connector 12 is aligned with the opening in the wall of the electrical box so that the cable 26 can be inserted through the opening in the electrical box and passed through the cable passage 36 of the cable connector 12 to the position shown in FIG. 1 and FIG. 2. The opening in the front wall 42 has a dimension to allow the wires 32 to pass through and prevent the armor cladding of the cable from passing through the opening. The armor cladding of the cable as shown in FIG. 2 abuts the inner surface of the front wall 42. To remove the cable from the cable connector, a tool can be inserted into the cable connector 12 to pry the retainers 62 and 74 outwardly to release the tension on the armor cladding and enable the cable to be pulled from the connector.

Another embodiment of the invention is shown in FIGS. 10-19. In this embodiment, the electrical box assembly 90 includes the electrical box 10 and a cable connector 92. The electrical box is substantially the same as in the previous embodiment so that similar components are identified by the same reference number. The cable connector 92 has a body formed by the cable retainer 94 at a first end and a front wall 96 at a second end spaced from the first end. In the embodiment shown, two cable retainers 94 are joined together as a single unit to grip two separate cables passing through adjacent cable openings in the electrical box. In one embodiment, the cable retainers 94 are permanently fixed to the side wall.

The cable retainer 94 in the embodiment shown is a flat metal spring like member that is attached to the side wall 18 of the electrical box by rivets 98 or other fasteners passing through apertures 97 to overlie at least a portion of the cable opening 24. The cable retainer is sufficiently flexible to flex so that the bottom edge bends away from the side wall and upward from the rear wall of the electrical box when the cable is passed through the cable opening 24 so that the cable retainers able to grip the outer surface of the electrical cable.

The cable retainer 94 in the embodiment shown in FIGS. 16-19 is formed from a flat sheet of metal that is folded over to form two substantially flexible flat legs 100 and 102 for each cable retainer. The legs 100 and 102 are substantially flat, planar members and form a flap-like member overlying the cable openings. In the embodiment shown, two legs 100 and two legs 102 are joined along the top edge and separated by a gap or slot 127 so that each of the legs 100 and each of the legs 102 can bend independently of each other for gripping separate cables passing through the two adjacent cable openings in the electrical box as shown. The legs 100 and 102 can have a generally square or rectangular shape and preferably have width greater than a width of the respective cable opening to extend across the width of the cable openings as shown.

Figure 11:
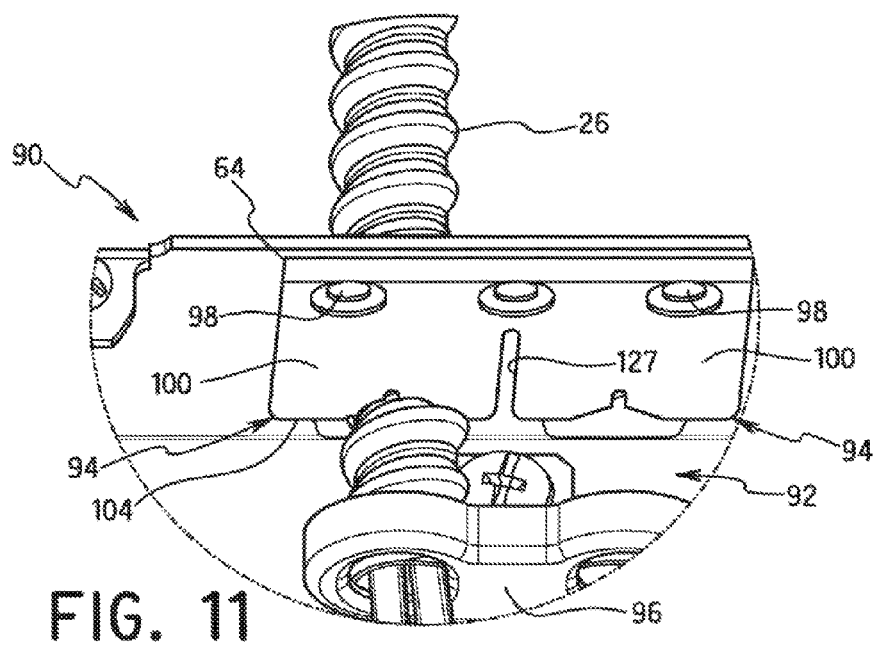
FIG. 11 is an enlarged view of the cable connector of FIG. 10.
Figure 12:
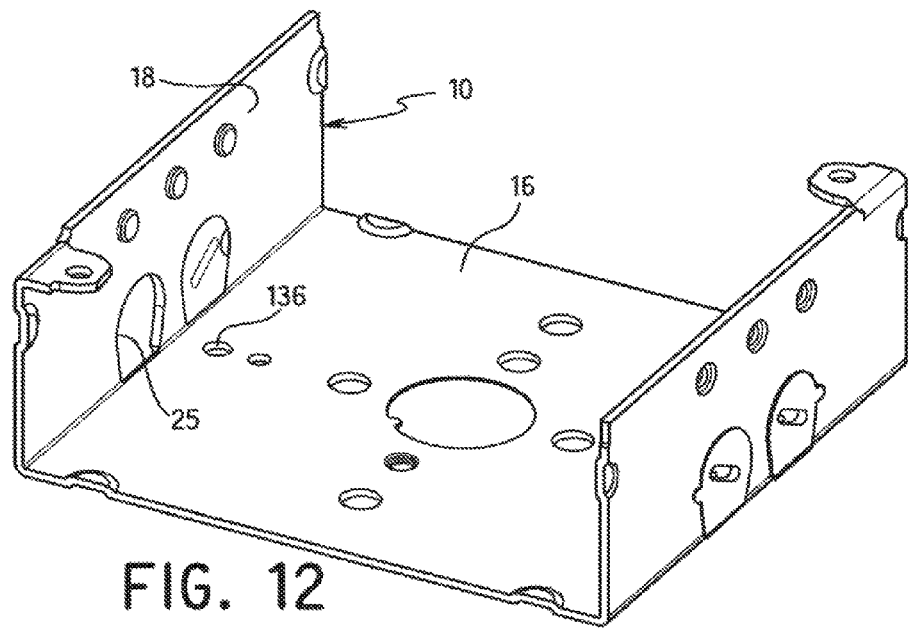
FIG. 12 is a perspective view of the electrical box.
Figure 13:
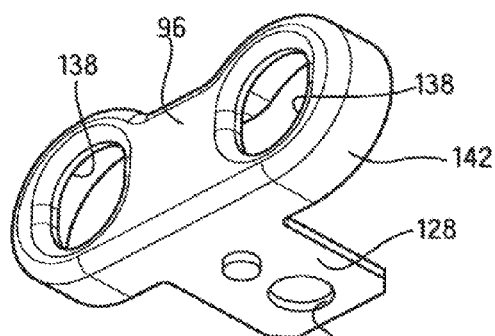
FIG. 13 is a front perspective view of the front wall.
Figure 14:
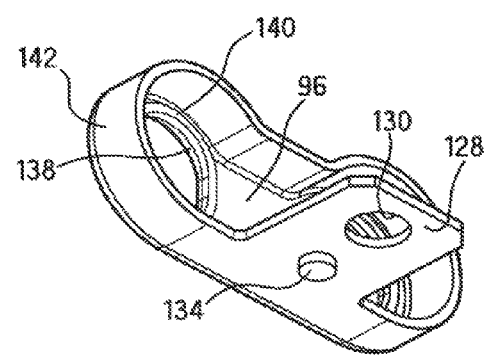
FIG. 14 is a rear perspective view of the front wall.
Figure 15:
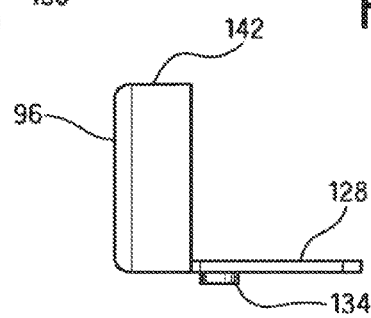
FIG. 15 is a side view of the front wall.
Figure 16:
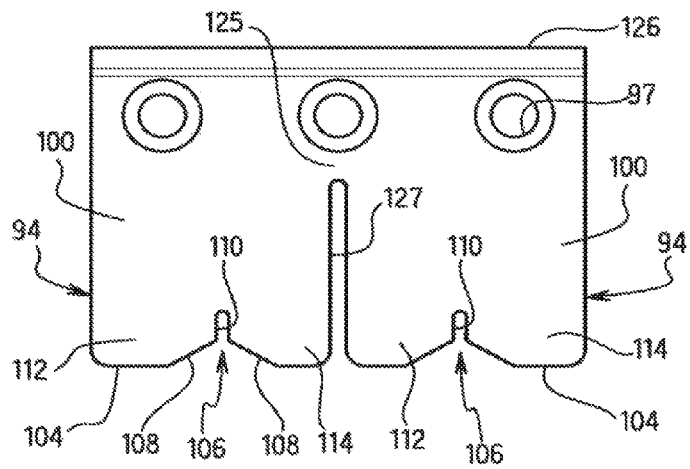
FIG. 16 is a front view of the cable retainer.

The first leg 100 has a bottom edge 104 with a profiled or scalloped shape for gripping the outer surface of the electrical cable. The bottom edge 104 in the embodiment shown in FIGS. 16-19 has a recess 106 form by two converging edges 108 that converge to a slot 110. The converging edges 108 form the recess 106 with a substantially V-shape complementing the outer dimension of the electrical cable. The slot 110 divides the first leg to form a first tab 112 and a second tab 114 on opposite sides of the slot 110. Each of the tabs 112 and 114 is able to flex independently to grip the outer surface of the spiral corrugated electrical cable 26 as shown in FIG. 11. The bottom edge 104 is spaced from the rear wall of the electrical box a distance less than the diameter of the cable 26 as shown in FIG. 11 so that the cable is gripped with sufficient force to retain the cable in the electrical box.

Figure 18:
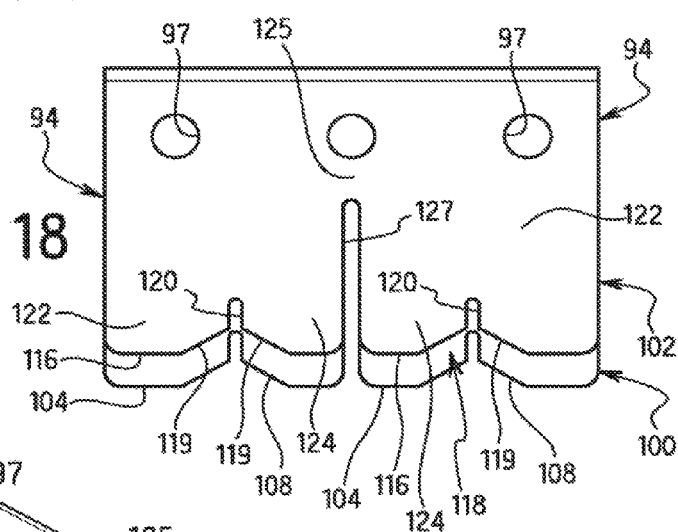
FIG. 18 is a rear view of the cable retainer.
Figure 19:
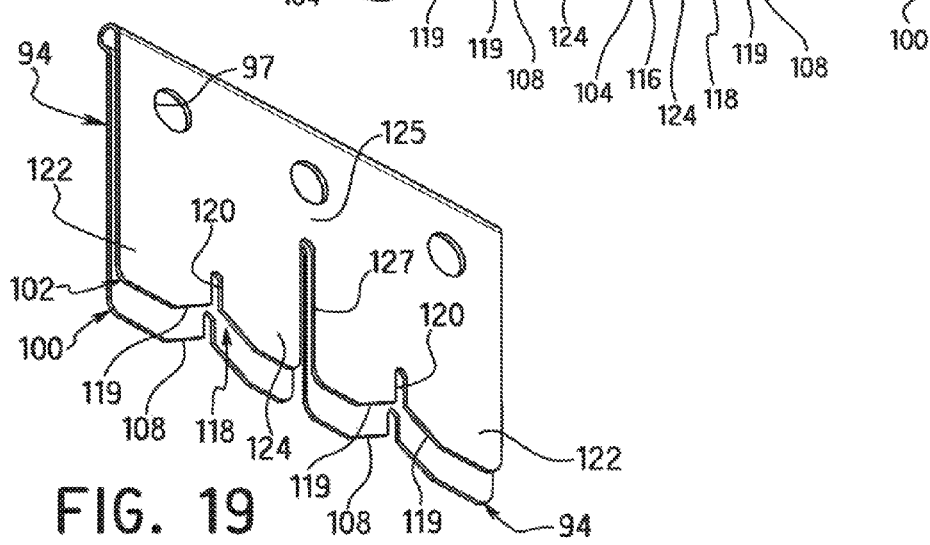
FIG. 19 is a rear perspective view of the cable retainer.

The second leg 102 has a substantially similar shape to the first leg 100 with a length less than the length of the first leg as shown in FIGS. 18 and 19 to extend into the cable openings so that the ends of the legs 100 and 102 are spaced apart from each other. The different lengths of the legs enable the retainer to grip different size cables. The first leg 100 has a length so that the bottom edge 104 is able to grip a smaller cable such as for example a 0.37-0.5 inch diameter cable. The second leg 102 to has a length so the bottom edge 116 is able to grip a larger cable, such as a 0.6-0.6 inch diameter cable. The bottom edges of the legs are spaced from the rear wall a distance less than the diameter of the cable being gripped to provide sufficient force to spring bias the legs against the outer surface of the cables.

Figure 17:
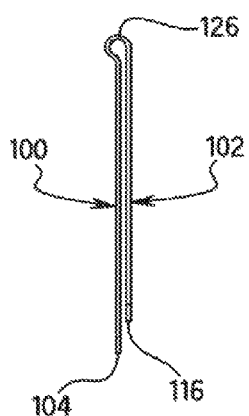
FIG. 17 is a side view of the cable retainer.

The second leg 102 has a bottom edge 116 with a recess 118 formed by inclined edges 119 that converge to form the substantially V-shaped recess. A slot 120 extends between the inclined edges 108 to define a first tab 122 and a second tab 124. As shown in FIG. 17, the first leg 100 and the second leg 102 are joined together at a top edge 126. In one preferred embodiment, the first leg and a second leg are integrally formed together as shown in FIG. 17 by a fold line defined by the top edge 126. Alternatively, the legs 100 and 102 can be formed separately and joined together be a suitable fastener or by welding. In the embodiment shown, two cable retainers are integrally formed together as a unit and joined together along the top edge 126 by a connecting portion 125 and separated by a slot 127 so that the retainers can flex and bend independently of each other. In preferred embodiments, the cable retainer is coupled to the inner face of the side wall of the electrical box along the top edge 126 or top end of the legs 100 and 102 and extends toward the rear wall to cover at least part of the cable openings. Coupling the retainer along the top end as shown allows the legs 100 and 102 to bend along a plane substantially parallel to the top edge and parallel to the rear wall.

Figure 10:
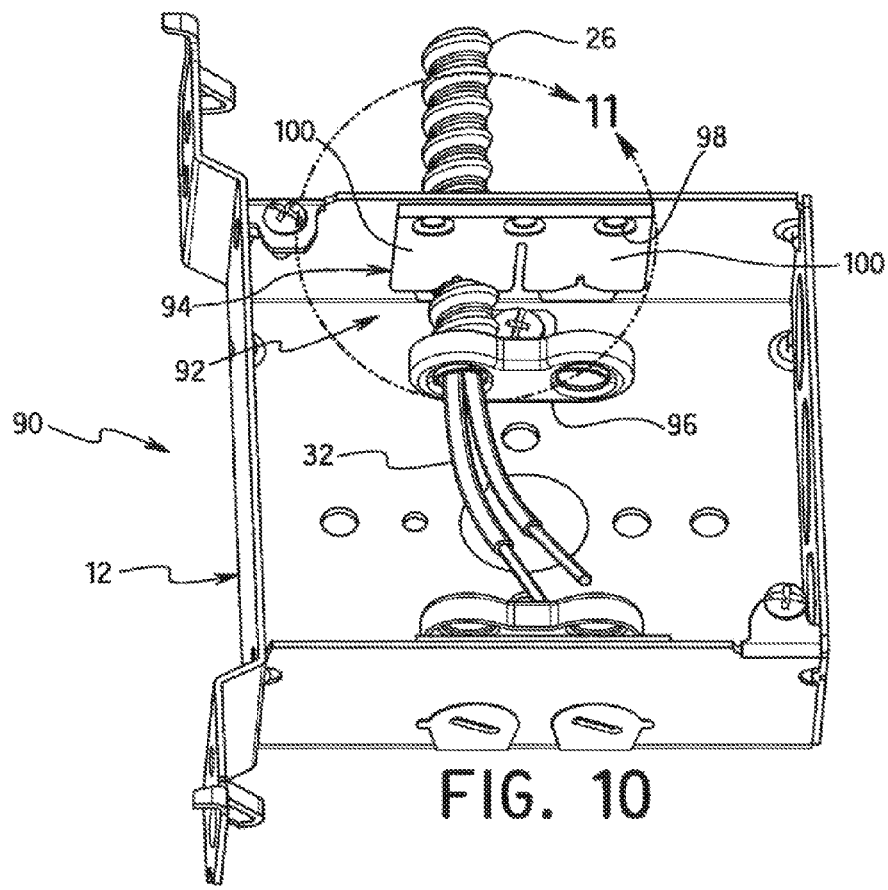
FIG. 10 is a top perspective view of a second embodiment of the invention.

In one embodiment, the bottom edges of the legs 100 and 102 are positioned over the cable openings with the bottom edges spaced from the rear wall a distance to grip the selected cable. Preferably each of the legs 100 and 102 is parallel to the plane of the side wall and has a width greater than a width of the cable openings. The front wall 96 of the cable connector 92 in the embodiment shown is attached to the rear wall 16 of the electrical box 10 to form a stop member for the armor cladding of the electrical cable 26 as shown in FIGS. 10 and 11. In this embodiment, the front wall is a stop member that is a separate component from the cable retainer. In other embodiments of the cable retainer and the front wall can be directly coupled together.

The front wall 96 includes a base 128 having a screw hole 130 for receiving a screw 132 to attach the front wall to the electrical box. A detent 134 extends from the bottom surface of the base 128 and is received in a corresponding aperture 136 formed in the bottom wall of the electrical box. The aperture 136 is oriented with respect to the cable openings 24 in the side wall 18 of the electrical box to position and align the front wall with the cable openings and prevent pivoting of the front wall around the axis of the screw 132.

The front wall 96 includes at least one and typically two apertures 138 for receiving the electrical wires 32 of the cable 26 as shown in FIG. 10 and complementing the cable retainers 94. The apertures 138 have a dimension to allow the electrical wires 32 to pass through and a dimension to prevent the armor cable from passing through. The apertures 138 are preferably punched to form an inwardly extending collar 140. As shown, the front wall 96 defines the second end of the cable retainer 94. A side wall 142 extends from the front wall 96 to surround the armor cable sheath.

The cable retainer is attached to the sidewall of the electrical box so that the bottom edges of the legs 100 and 102 overlie at least a portion of the cable openings in the electrical box. As shown in the drawings, a metal clad cable is inserted through the cable opening in the electrical box to deflect and bend the legs 100 and 102 of the cable retainers 94 inwardly with respect to the electrical box. The inclined bottom edges of the legs grip the cable between the inclined edges and the rear wall of the electrical box and prevent removal of the cable from the electrical box. The end of the armor sheath abuts the front wall 96 while allowing the wires to pass through.

Figure 20:
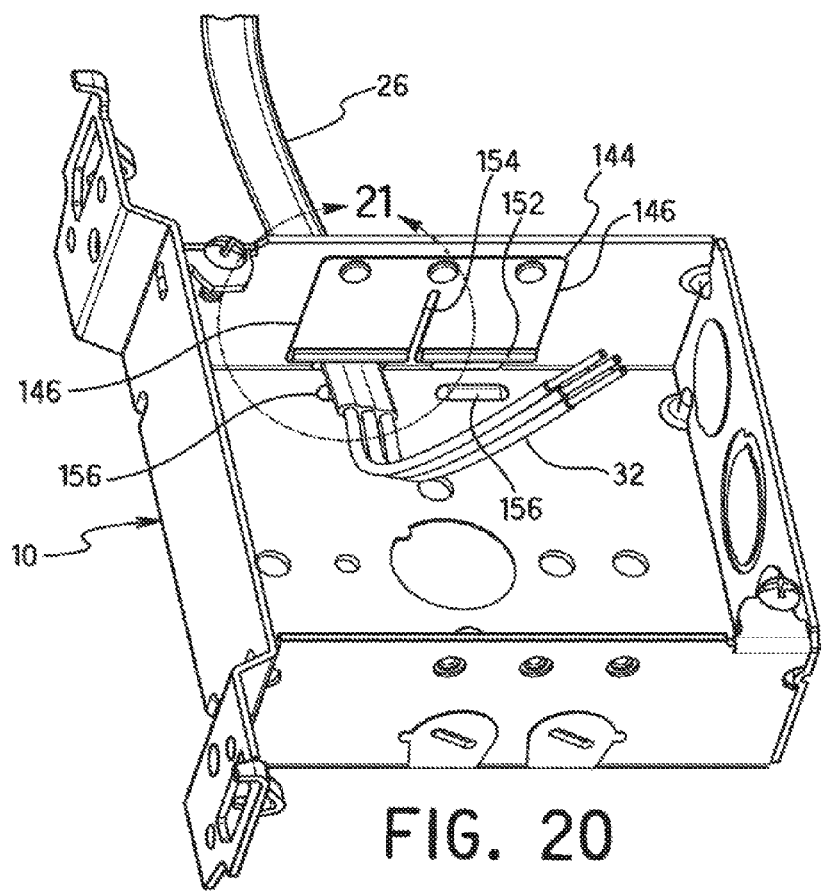
FIG. 20 is a perspective view of the electrical box assembly in a third embodiment.
Figure 21:
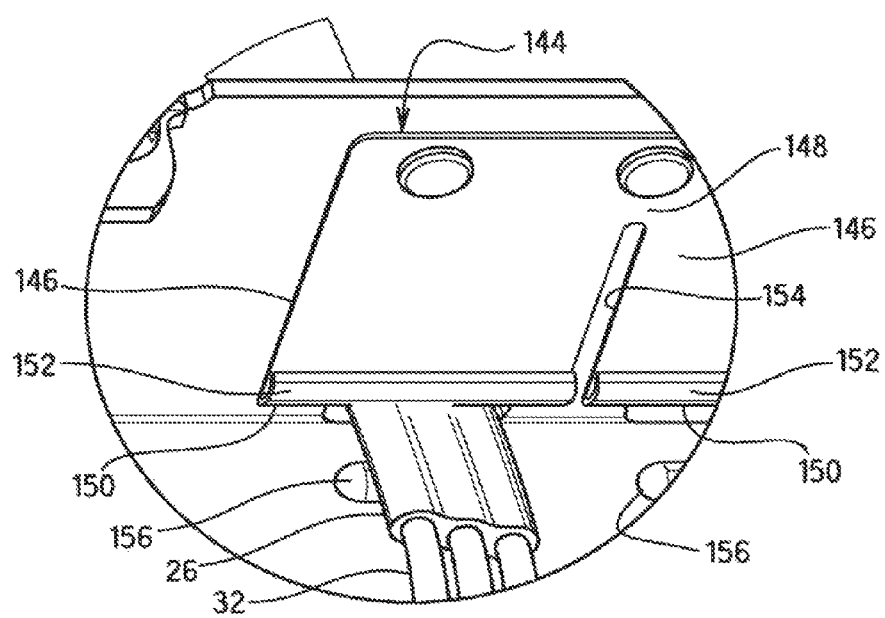
FIG. 21 is an enlarged view of the cable retainer of FIG. 20.

In another embodiment shown in FIGS. 20-21, a cable connector 144 is attached to the side wall of the electrical box by fasteners in a manner similar to the previous embodiment. In this embodiment of the invention, the cable connector 144 has two adjacent cable retainers 146 joined together by a top end 148 which is fastened to the side wall of the electrical box. Each retainer 146 forms a flexible or bendable leg with a bottom end 150 that overlies at least a portion of a respective cable opening in the side wall of the electrical box. The bottom end 150 of each cable retainer 146 has a rolled edge 152 which is able to grip the outer surface of a nonmetallic sheathed electrical cable as shown in FIGS. 20-21. In the embodiment shown, the cable retainers 146 are separated by a slot 154 so that each cable retainer 146 can flex and bend independently of the other. A detent 156 is formed in the rear wall of the electrical box adjacent the cable openings and extends into the cavity of the electrical box a distance to engage and support the electrical cable. The cable connector 144 is attached to the side wall of the electrical box so that each of the cable retainers 146 overlies two adjacent cable openings in the electrical box. The cable 26 is inserted through the cable opening in the electrical box to deflect the cable retainer 146 away from the side wall. The cable retainers are biased downwardly onto the cable to capture the cable between the bottom edge 150 and a detent 156.

FIGS. 22-27 show another embodiment of the invention. In this embodiment, the cable connector 160 is attached to the bottom wall 16 and side wall 18 of the electrical box 10 for connecting the electrical cable to the electrical box. In the embodiment shown, the cable connector 160 has a body 162 with a first end 164 and a second end 166. The body 162 is formed by opposite side walls 168 and a top wall 170 extending between the first end 164 and the second end 166. A front wall 172 is provided at the second end 166. In the embodiment shown, the front wall 172 is integrally formed with the top wall 170. The front wall 172 has an aperture 174 with a collar 176 for receiving the electrical wires. In the embodiment shown, the front wall 172 has a flange 178 formed along a bottom edge and extending substantially perpendicular to the plane of the front wall 172 for coupling the cable connector 160 to the bottom wall of the electrical box by welding, rivets or other fastening means.

Figure 22:
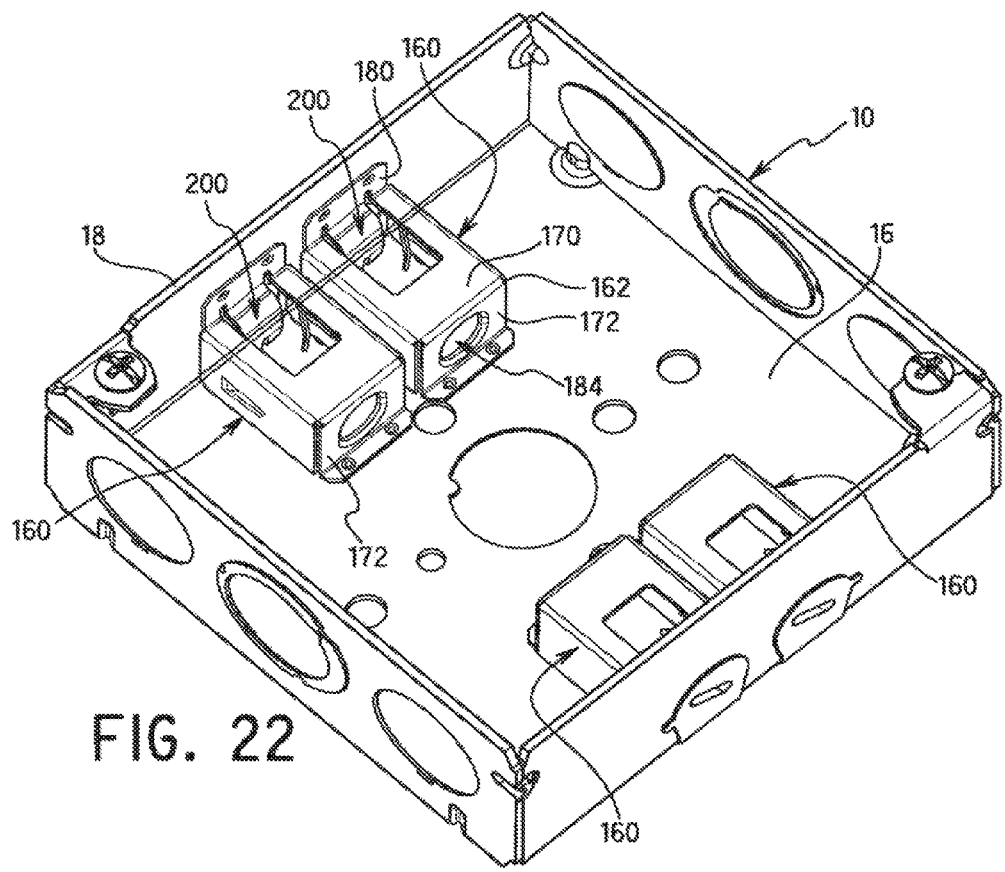
FIG. 22 is a perspective view of the electrical box assembly in a fourth embodiment.

A rear wall 180 is provided at the first end 164. The rear wall 180 in the embodiment shown is coupled to the first end of the top wall 170 and extends upwardly in a direction substantially perpendicular to the plane of the top wall for attaching to a side wall of the electrical box as shown in FIG. 22. The rear wall 180 also can be attached to the side wall of the electrical box by welding or other fastening means.

Figure 23:
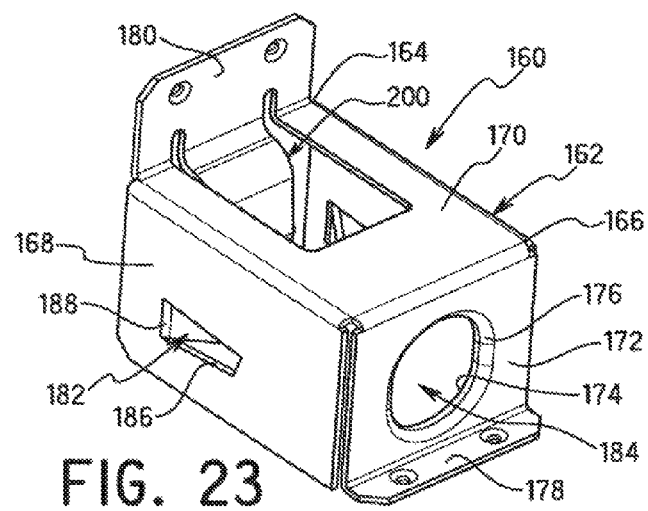
FIG. 23 is a perspective view of the cable connector.
Figure 24:
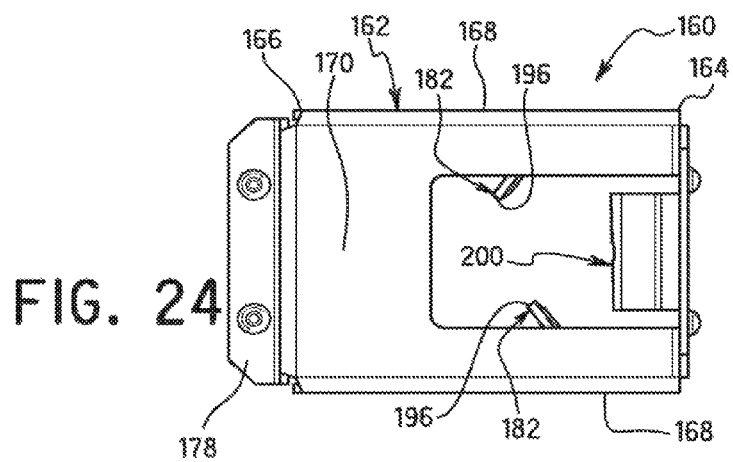
FIG. 24 is a top view of the cable connector of FIG. 23.
Figure 27:
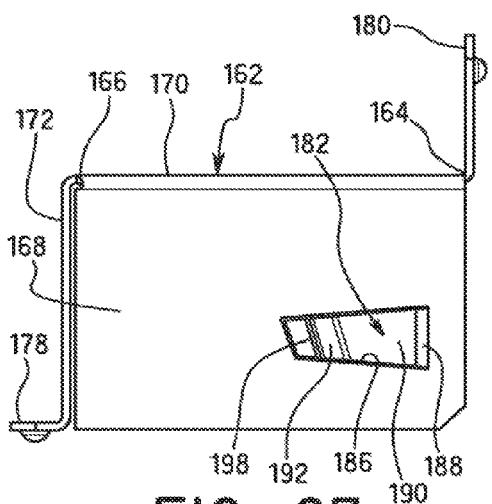
FIG. 27 is a side view of the cable connector of FIG. 23.

Each side wall 168 has a cable retainer 182 that extends into the cable passage 184 for gripping the outer surface of the electrical cable in a manner similar to the previous embodiments. In the embodiment shown, the cable retainer 182 is cut and punched from the respective side wall to form an opening 186 so that the cable retainer 182 is integrally formed with the respective side wall at the first end 164 by a fold line 188 as shown in FIG. 23 and FIG. 27. The cable retainers 182 extend inwardly towards the cable passage 184 in a direction toward the front wall 172. Retainers 182 on the opposite side walls converge toward the axis of the cable passage 186 to grip opposite sides of the electrical cable.

Figure 25:
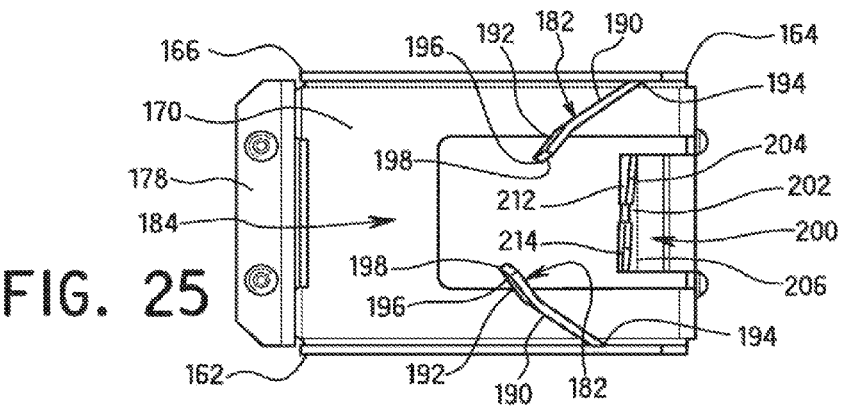
FIG. 25 is a bottom view of the cable connector of FIG. 23.

As shown in FIG. 25, the cable retainer 182 has a first leg 190 extending inwardly from the side wall and a second leg 192 extending from the first leg 190. The cable retainer 182 is coupled to the side wall at a first end 194 and has a second free end 196. The free ends 196 have an angled edge 198 that are inclined at an angle corresponding to the corrugations of the armor cable. As shown, the angled edge of the free ends 196 are angled so that the top corners converge toward the top wall 170 and the front wall 172 to grip the cable between the free ends 196 and the rear wall 16 of the electrical box 10.

The rear wall 180 includes a leg 200 forming part of the cable retainer 182 for gripping a top surface of the electrical cable. The leg 200 in the embodiment shown is integrally formed with the rear wall 180 and extends in a generally downward direction from the top wall 170 toward the cable passage 184. The leg 200 and the cable retainers are sufficiently flexible to deflect outwardly when a cable is inserted through the cable opening in the electrical box and to grip the outer surface of the cable.

Figure 26:
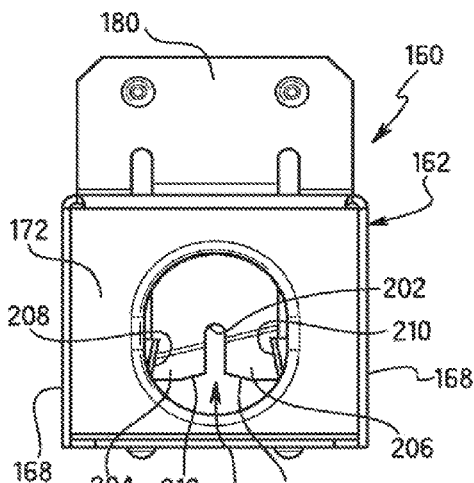
FIG. 26 is a front view of the cable connector of FIG. 23.

The leg 200 as shown in FIG. 25 and FIG. 26 includes a bottom edge with a slot 202 forming a first coupling tab 204 and a second coupling tab 206. As shown, the coupling tabs 204 and 206 are coupled to the leg 200 by an inclined fold line 208 and 210, respectively, so that the coupling tabs extend at an incline angle with respect to the plane of the leg 200 and have different lengths to enable gripping of the spiral corrugated armor cable. The coupling tabs 204 and 206 are generally angled in a downward direction towards the cable passage to grip the top edge of the cable and capture the cable between the coupling tabs and bottom wall of the electrical box. As shown in FIG. 26, the bottom edges of the coupling tabs 204 and 206 have converging edges 212 and 214, respectively, to conform to the outer surface of the cable. As shown in FIG. 23, the leg 200 can be cut from the top wall 170 and bend into the cable passage.

FIGS. 28-31 illustrate another embodiment of the cable connector coupled to the electrical box. In this embodiment, the cable connector 220 is formed by a body 222 having a first end 224 and an opposite second end 226 spaced from the first end 224 for receiving two spaced apart electrical cables in two separate cable passages. The body 222 is defined by a bottom wall 228 extending between the first and second end, a front wall 230 extending upwardly from the bottom wall 228 substantially perpendicular to the plane of the bottom wall at the second end 226, and a rear wall 232 extending upwardly from the bottom wall 228 at the first end 224. The front wall 230 has two openings 234 for receiving the electrical cable 26. In the embodiment shown, a grommet 236 is inserted in the openings in the front wall to define the two cable passages 238 through the cable connector 220. The grommet 236 has an aperture 240 to receive the electrical wires 32. Coupling tabs 242 extend outwardly from the sides of the grommet 236 for coupling the grommet 236 to the front wall 230.

Figure 30:
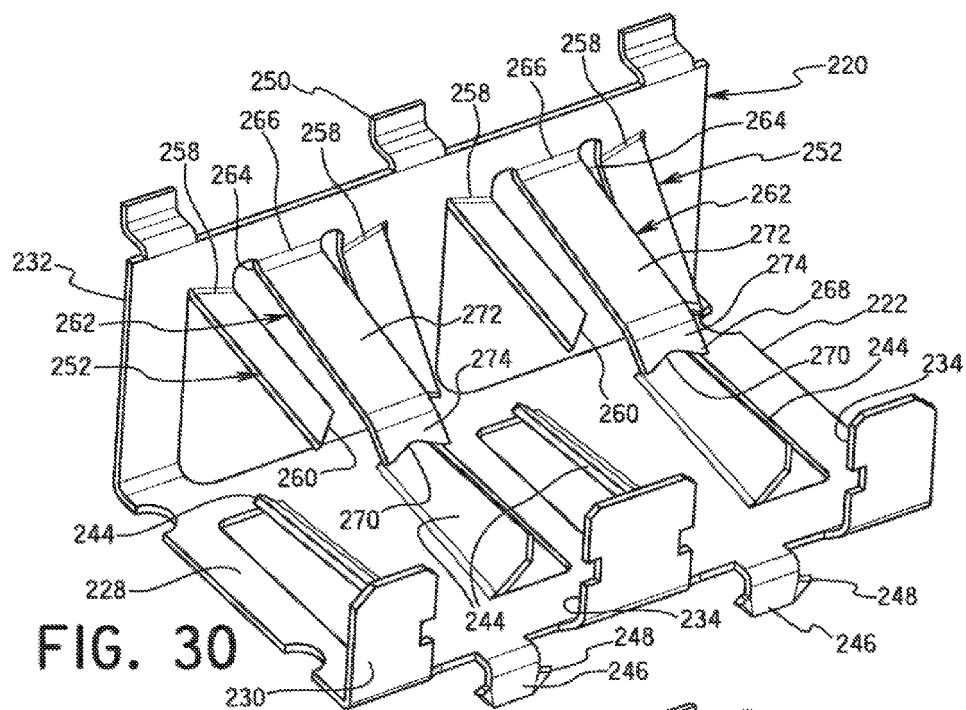
FIG. 30 is a perspective view of the cable connector of FIG. 28.
Figure 31:
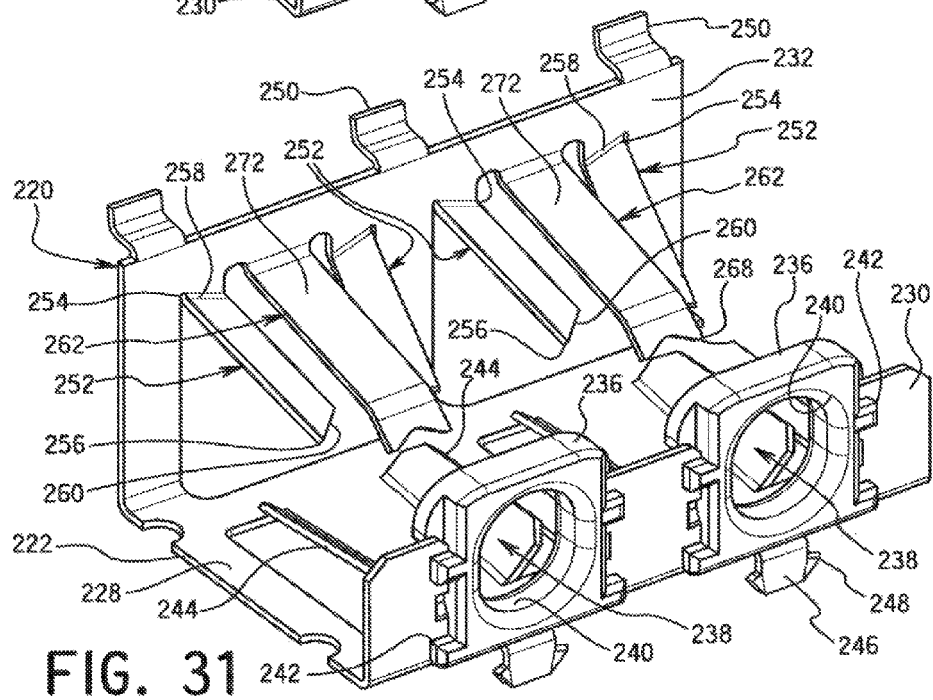
FIG. 31 is a perspective view of the cable retainer showing the grommet is inserted in the cable connector.

As shown in FIGS. 30 and 31, the bottom wall 228 includes flanges 244 cut from the bottom wall and bent upwardly at an incline on opposite sides of each of the cable passages 238 for supporting the electrical cable. As shown, the flanges 244 are formed on the opposite sides of the cable passage form a substantially V-shaped cradle for the electrical cable.

Figure 28:
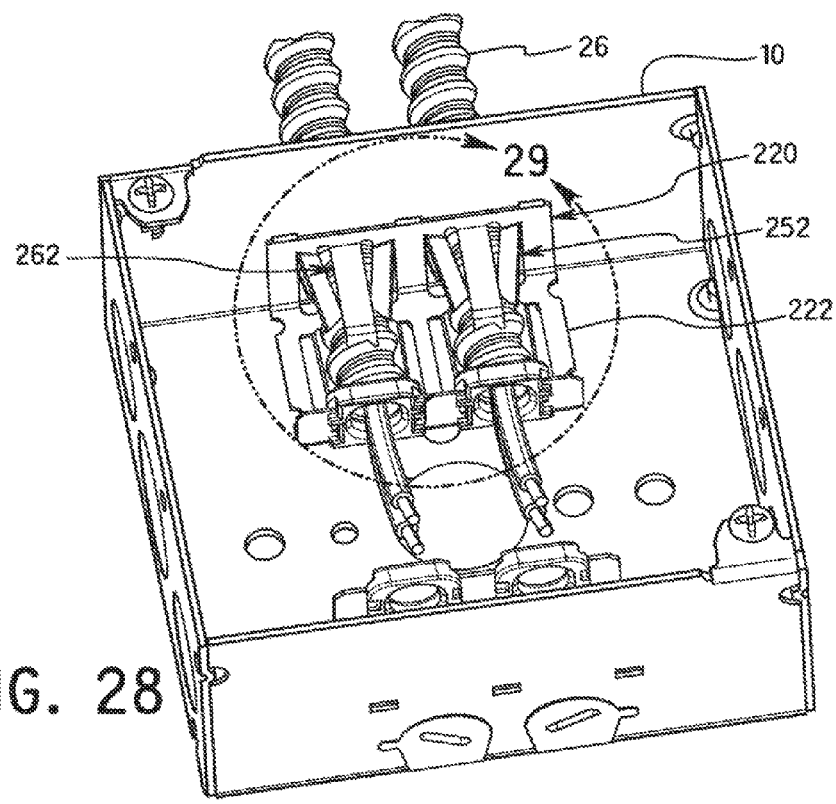
FIG. 28 is a perspective view of the electrical box assembly in fifth embodiment.
Figure 29:
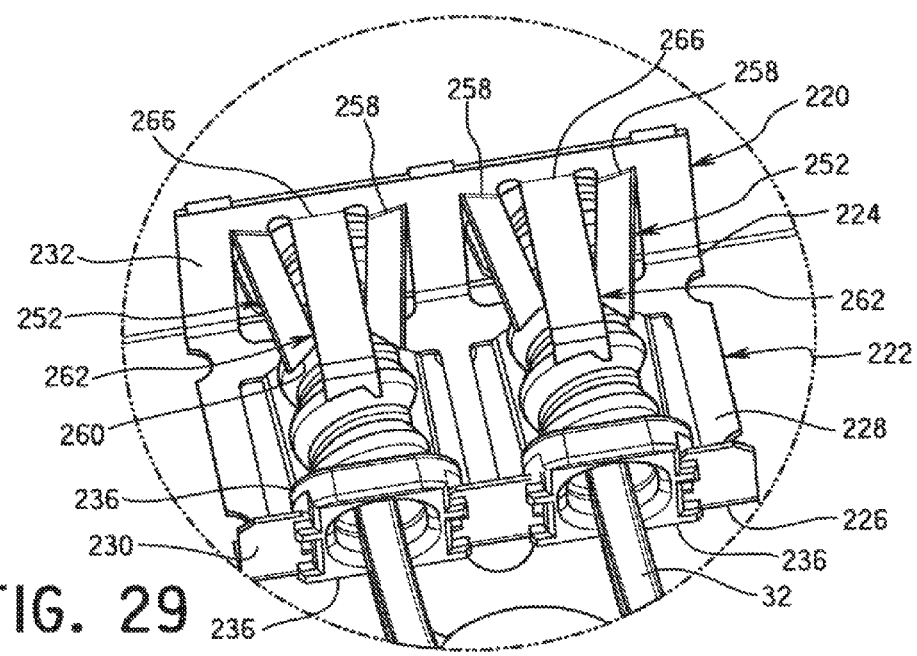
FIG. 29 is an enlarged perspective view of the cable connector of FIG. 28.

The front edge of the bottom wall 228 is formed with coupling tabs 246 forming a prong 248 that is inserted into a corresponding opening in the rear wall 16 of the electrical box for coupling the cable connector 220 to the bottom wall of the electrical box. The rear wall 232 of the cable connector 220 has a plurality of L-shaped tabs 250 along the top edge for inserting into corresponding slots or apertures in the side wall for coupling the cable connector 220 to the electrical box as shown in FIGS. 28 and 29.

The first end 224 of the cable connector 220 includes cable retainers 252 having a first end 254 coupled to the rear wall 232 and a second free end 256. The cable retainers 252 form a leg that extends toward the front wall 230 and are inclined toward the bottom wall and toward the respective cable passage 238. As shown, the cable retainers 252 are coupled to the rear wall 232 by inclined fold lines 258 so that the cable connectors are angled toward the respective cable passage 238 to grip opposite sides of the electrical cable. The second end 256 of the cable retainers 220 have an inclined edge 260 that are angled to grip the corrugated armor cable to effectively grip the cable and hold the cable in place.

A centrally located leg 262 extends from the rear wall 232 between the cable retainers 252. A first end 264 is coupled to the rear wall 232 by a fold line 266 so that the leg 262 extends at an incline with respect to the plane of the rear wall 232 toward the front wall 230 and towards the cable passage 238. The leg 262 has a second end 268 with a substantially V-shaped edge 270 for engaging the top side of the cable and capturing the cable between the leg 262 and the bottom wall 228 of the cable connector 220. The leg 262 is formed by a first section 272 that extends at an incline with respect to the plane of the rear wall 232 and a second section 272 that extends in a generally downward direction at an angle with respect to the first section 272 and toward the cable passage 238.

Figure 32:
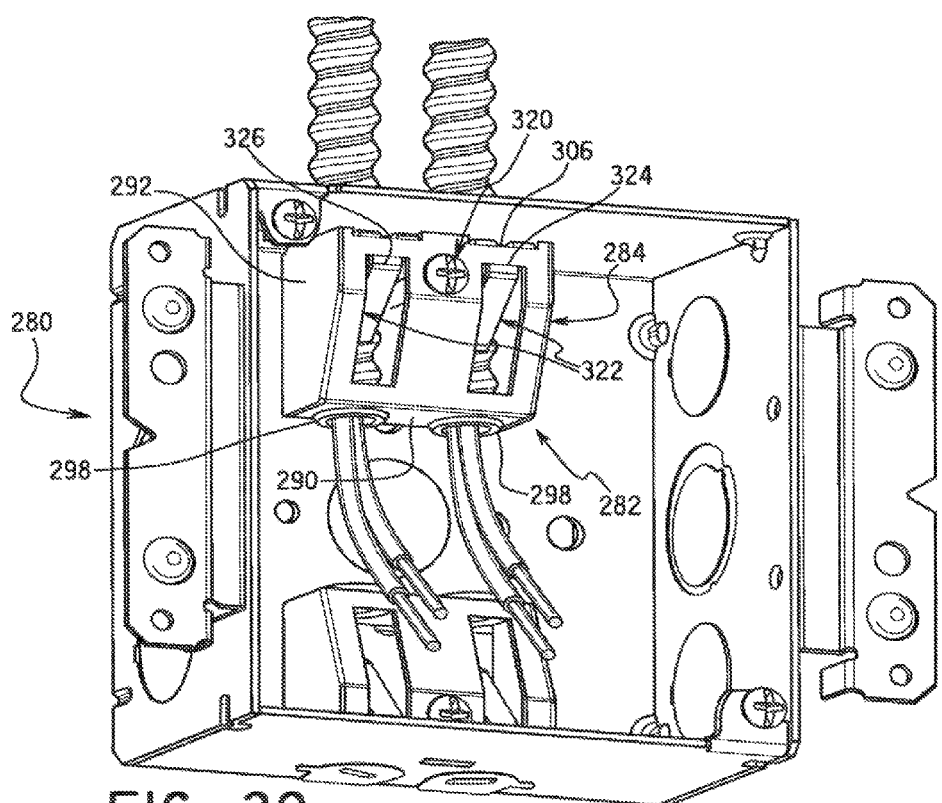
FIG. 32 is a perspective view of the electrical box assembly in sixth embodiment.

Another embodiment of the invention is shown in FIGS. 32-37. Referring to the drawings, electrical box assembly 280 includes a cable connector 282 coupled to the electrical box 10 for receiving two spaced apart cables. The cable connector 280 includes a body 284 having a first end 286 and a second end 288 and a front wall 290 at the second end 288. Side walls 292 extend between the first end 286 and the second end 288 of the body 284. A top wall 294 extends between the side walls 292 and between the first end 286 and the second end 288. The first end 286 is configured to be positioned next to the side wall of the electrical box and the cable opening for receiving the electrical cable as shown in FIG. 32.

The front wall 290 includes two spaced apart apertures 296 aligned with the respective cable opening in the side wall of the electrical box for receiving the electrical wires as shown in FIG. 32. A punched collar 298 surrounds the apertures 296 to guide the wires through the aperture. The apertures 296 are aligned with the cable passage 298 for the cable extending between the first end 286 and the second end 288 of the body 284.

In the embodiment shown, cable retainers 300 are provided for each cable passage on the first end 286 and extend toward the front wall 290. The cable retainers 300 extend at an incline toward the front wall 290 and toward the axis of each of the cable passages 298. As shown, two cable retainers 300 are provided for each of the cable passages 298 for gripping the outer surface of the armor cable. The cable retainers 300 have a first end 302 at the first end 286 of the body and a second end 304 extending toward the front wall 290 at the second end 288.

Figure 33:
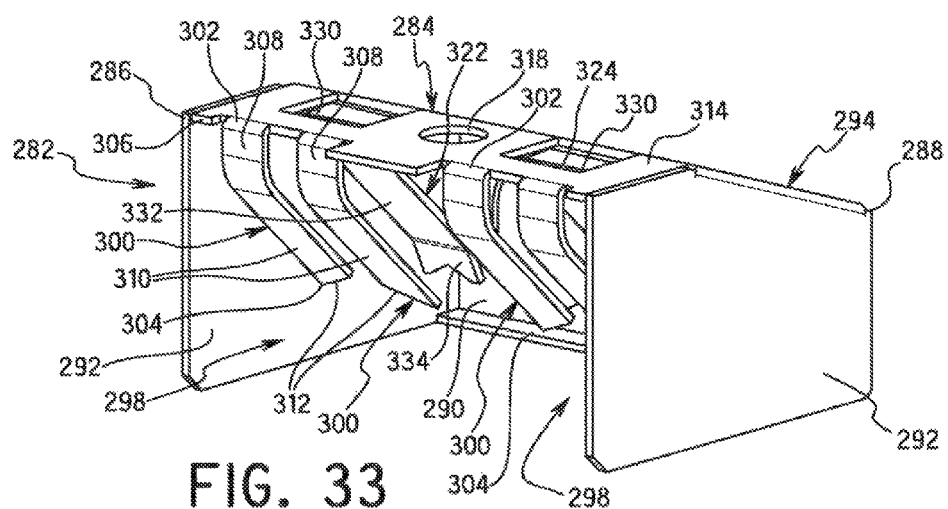
FIG. 33 is a rear view of the cable connector of FIG. 32.

Referring to FIG. 33, the cable retainers 300 are coupled to and integrally formed with a first end 306 of the top wall 294. Each of the cable retainers are defined by a first leg 308 that extends in a downward direction from the top wall 294 in the direction substantially perpendicular to the plane of the top wall at the first end 306 of the top wall. A second leg 310 extends from the first leg 308 with a distal end defining the second free end 304 of the cable retainer 300. The second leg 310 extends at an inclined angle with respect to the first leg 308 toward the axis of the cable passage 298. The second free end 304 of the cable retainers 300 have an angled edge 312 for gripping the corrugated metal sheath of the cable as shown in FIG. 32.

As shown in FIG. 33, the cable retainers 300 for each cable passage 298 are spaced apart a distance to engage opposite surfaces of the electrical cable to capture the electrical cable between the end edges 312 and the rear wall of the electrical box. The end edges 312 of the complementing cable retainers 300 are angled to converge toward the axis of the cable passage 298 and form a substantially V-shaped recessed area between adjacent cable retainers for engaging the electrical cable.

The top wall 294, as shown in FIG. 33 and FIG. 34, has a first top portion 314 extending substantially parallel to the plane of the cable passage 298 and a second top portion 316 extending at an incline between the first top portion 314 and the front wall 290. A screw aperture 318 is formed in the first top wall portion 314 for receiving a screw 324 coupling the cable retainer 300 to the electrical box as shown in FIG. 32.

A leg 322 extends from the first end 286 towards the second end 288 of the body 284 and is positioned between the pair of cable retainers 300 for each of the cable passages 298. The leg 322 has a first end 324 coupled to the first top wall portion 314 at the first end 302 of the top wall portion and extends toward the axis of the cable passage 298 terminating in a second free end 326. In the embodiment shown, the leg 322 is integrally formed with the first top wall portion 314 by cutting and punching the leg 322 from the top wall portion 314 to form an opening 328 so that the leg is coupled to an inner edge 330 of the opening 328. The leg 322 is formed by a first portion 332 extending from the first top wall portion 314 and a second leg portion 334 with a distal end defining the second free end 304 of the cable retainer 300. The second leg portion 334 extends at a downward angle with respect to the first leg portion 332 toward the axis of the cable passage 298. The second leg portion 334 has an outer edge with inclined surfaces 336 forming a substantially V-shaped recess 338 to grip the top surface of the electrical cable.

The cable connector 282 is attached to the electrical box as shown in FIG. 32 with the first end 286 positioned next to or adjacent the cable openings in the electrical box. The cable connector 282 is attached to the electrical box by the mounting screw 320. In the embodiment shown, the cable connector 282 is configured for receiving to electrical cables and is provided with two parallel cable passages 298 and the corresponding cable retainers 300 for each of the cable passages 298. The electrical cable is inserted through the cable opening in the wall of the electrical box so that the armor cable slides past the ends of the cable retainers 300 and the leg 322 so that the armor cable abuts the inner surface of the front wall 290. The angled edges of the cable retainers engage opposite sides of the cable while the leg 322 engages the top surface of the cable to capture the cable between the rear wall of the electrical box and the cable retainers 300 and leg 322. Preferably, the cable connector 282 is a one piece unitary unit formed from a single piece of sheet metal that is cut, stamped and bent to the configuration shown in FIGS. 32-37.

A further embodiment of the invention is shown in FIGS. 38-46. In this embodiment, the electrical box assembly 350 includes a cable connector 352 coupled to the rear wall of the electrical box. Typically, the cable connector 352 is coupled to the electrical box by welding or by a mounting screw.

Figure 45:
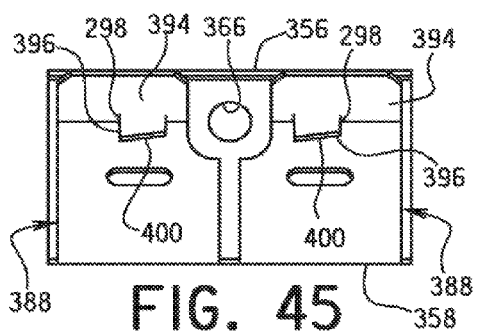
FIG. 45 is a bottom view of the cable connector of FIG. 38.
Figure 46:
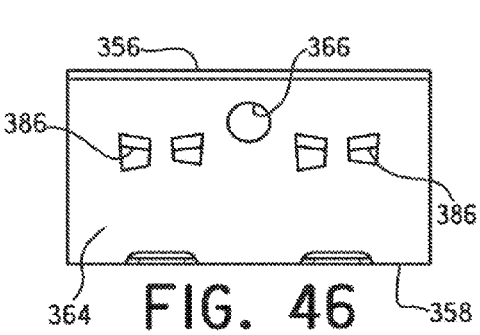
FIG. 46 is a bottom view of the cable connector of FIG. 38.

The cable connector 352 includes a body 354 having a first end 356 and a second end 358, a rear wall 360 at the first end 356 and a front wall 362 at the second end 358. The body 354 has a bottom wall 364 extending between the rear wall 360 and the front wall 362. As shown in FIG. 45 a screw hole 366 is formed in the bottom wall 364 for coupling the cable connector 352 to the electrical box by a screw 368. In the embodiment shown, the cable connector is configured for receiving two spaced apart electrical cables and independently retaining each cable.

Figure 39:
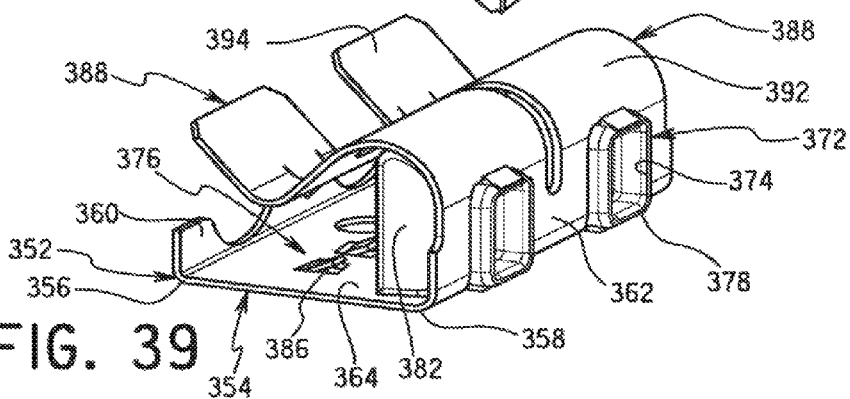
FIG. 39 is a front perspective view of the cable connector of FIG. 38.
Figure 40:
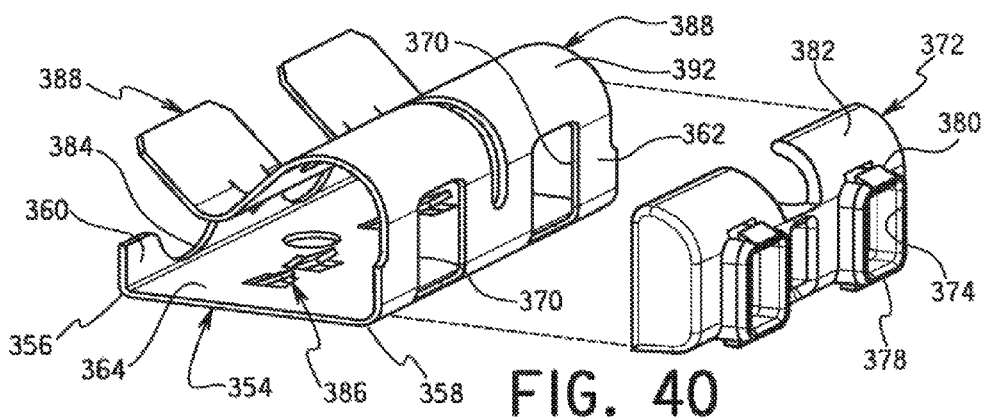
FIG. 40 is a perspective view of the cable connector and grommet of FIG. 38.
Figure 41:
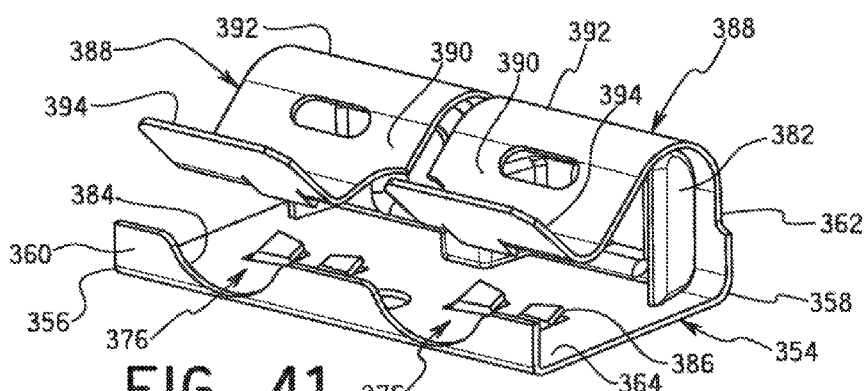
FIG. 41 is a rear perspective view of the cable connector of FIG. 38.
Figure 42:
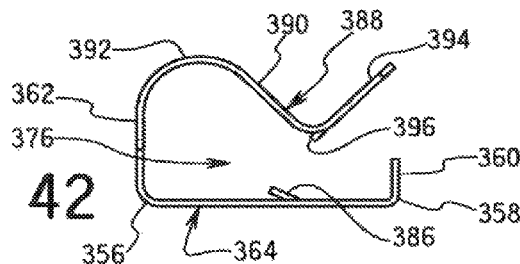
FIG. 42 is a side view of the cable connector of FIG. 38.
Figure 43:
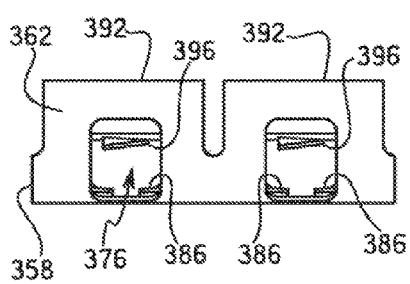
FIG. 43 is a front view of the cable connector of FIG. 38.

The front wall 362 extends substantially perpendicular from the bottom wall 364 and is provided with two spaced apart openings 370 for receiving a plastic grommet 372. The grommet 372 has an opening 374 defining the cable passage 376 extending through the cable connector 352. The grommet has a collar 378 extending through the opening 370 in the front wall 362 and includes a tab 380 for coupling the grommet 372 to the front wall 362. In the embodiment shown, the grommet 372 is positioned on the inner face of the front wall 362 so that the collar 378 extends through the openings 370 in the front wall 362 as shown in FIG. 39. The grommet 372 has a body 382 with a shape to conform to the inner face of the front wall 362. The rear wall 360 has a substantially U-shaped opening 384 for receiving the electrical cable and aligned with the cable passage 376.

Bottom wall 364 is provided with a pair of cable retainers 386 that project into the respective cable passage 376 and toward the front wall 362. In the embodiment shown, two cable retainers 386 are angled toward the front wall 362 and toward the axis of the cable passage 376. The cable retainers 386 are spaced apart a distance and aligned with the axis of the cable passage 376 for supporting and engaging the outer surface of the electrical cable.

A top wall 388 in the embodiment shown is integrally formed with the front wall 362. The top wall 388 forms a spring member and flexes and bends with respect to the front wall and is spring biased in a downward direction toward the bottom wall 364. The top wall 388 has a first section 390 coupled to the front wall 360 by a U-shaped portion 392. A second section 394 is coupled to the end of the first section 390. In the embodiment shown, the first section 390 extends in a generally downward direction toward the bottom wall 364 and a second section 394 extends in the generally upward direction away from the bottom wall 364. In the embodiment shown, the top wall is divided by a gap to form two flexible top portions for gripping two cables.

Figure 44:
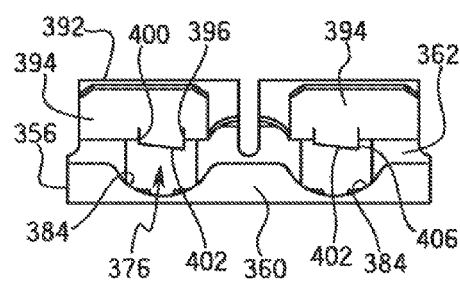
FIG. 44 is a rear view of the cable connector of FIG. 38.

A leg 396 extends from the first end 356 of the body and each portion of the top wall 388 toward the second end 358 in a generally downward direction toward the bottom wall 364 and the axis of the respective cable passageway 376. In the embodiment shown, the leg 396 is cut and punched from the second section 394 to form the leg with a first end 398 and a second free end 400. The second free end 400 has an inclined or angled edge 402 angled to grip the outer surface of the cable as shown in FIG. 44.

Figure 38:
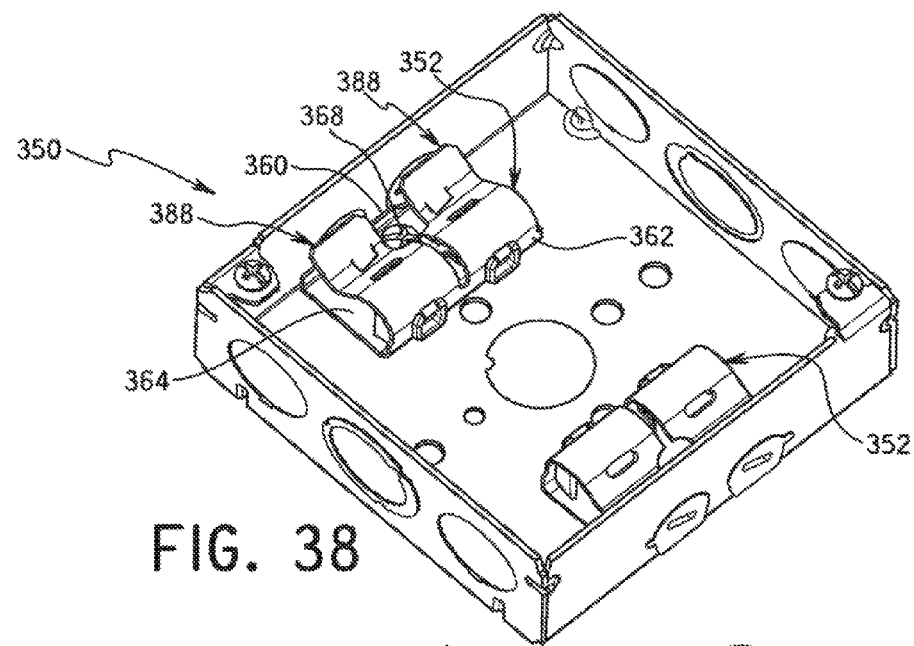
FIG. 38 is a perspective view of the electrical box assembly in a seventh embodiment.

The cable connector 352 is mounted in the electrical box as shown in FIG. 38 with the rear wall 360 positioned next to or adjacent the cable opening in the electrical box. The electrical cable is passed through the cable opening in the electrical box and fits between the tabs 386 on the bottom wall 364 and the free end 400 of the cable retainer 396. The tabs 386 and the free end 400 of the cable retainer are angled toward the axis of the cable passage and toward the front wall 362 to allow the cable to be inserted through the cable passage and resist removal of the cable. In the embodiment shown, the armor sheath abuts the inner face of the grommet 372 while allowing the electrical wires to pass through the opening in the grommet.

In the various the embodiments of the invention, the cable connector of the invention as shown is configured for receiving two parallel electrical cables passing through a corresponding cable opening in the electrical box and for feeding the electrical wires to the cavity of the electrical box. Each of the cable connectors in the embodiment shown includes two sets of cable retainers that are oriented to grip the cables independently of the other. The respective pairs of cable retainers are oriented with respect to the cable passage for gripping opposite sides of the cable for retaining the cable in the cable connector.

While one embodiment has been chosen to illustrate the invention, it will be understood that various changes and modifications can be made without departing from the scope of the invention.

We claim:

1. An electrical box assembly comprising:
an electrical box including a rear wall and a side wall extending from the rear wall, the side wall and the rear wall extending around a partially enclosed portion, the side wall including at least one opening extending therethrough for receiving an electrical cable; a cable retainer supported relative to the electrical box, the cable retainer including a first leg positioned in the partially enclosed portion and a second leg positioned in the partially enclosed portion, the first leg and the second leg overlying at least a portion of the opening, each of the first leg and the second leg including an edge positioned adjacent the opening for gripping an outer surface of the cable passing through the cable opening; and
a wall secured to the electrical box and spaced apart from the first leg and the second leg, the wall including at least one hole aligned with the at least one opening of the electrical box.

2. The electrical box assembly of claim 1, wherein the first leg is oriented substantially parallel to the second leg, the first leg and the second leg at least partially overlying each other, the edge of the first leg and the edge of the second leg are spaced apart from one another.

3. The electrical box assembly of claim 1, wherein the first leg and the second leg have different lengths.

4. The electrical box assembly of claim 1, wherein at least one of the edge of the first leg and the edge of the second leg includes a substantially V-shaped recess aligned with an axis of the opening, the recess engaging an outer surface of the cable and securing the cable against the rear wall of the electrical box.

5. The electrical box assembly of claim 1, wherein the first leg and the second leg are integrally formed together.

6. The electrical box assembly of claim 1, wherein the edge of the first leg extends toward the rear wall and is spaced apart from the rear wall by a distance less than a diameter of the cable.

7. The electrical box assembly of claim 1, wherein the hole of the wall includes a collar extending toward the opening in the side wall of the electrical box.

8. The electrical box assembly of claim 1, wherein the side wall of the electrical box includes a pair of openings, wherein the cable retainer includes a pair of first legs and a pair of second legs, the first legs separated from one another by a gap such that the first legs are bendable independently of each other, the second legs separated from one another by the gap such that the second legs are bendable independently of one another.

9. An electrical box assembly comprising:
an electrical box including a rear wall and a side wall extending from the rear wall, the side wall and the rear wall at least partially enclosing a cavity, the side wall including a pair of openings extending therethrough, each opening configured to receive an electrical cable;
a cable retainer supported relative to the electrical box, the cable retainer including a pair of first legs and a pair of second legs positioned in the cavity, each second leg overlying the associated first leg, the second leg and the associated first leg both overlying at least a portion of the associated opening, each first leg including an edge aligned with the associated opening and extending toward the rear wall, each second leg including an edge aligned with the associated opening and extending toward the rear wall, the first legs spaced apart from each other by a gap such that the first legs are bendable independently of each other, the second legs spaced apart from each other by the gap such that the second legs are bendable independently of each other.

10. The electrical box assembly of claim 9, further comprising a wall secured to the electrical box and spaced apart from the first legs and the second legs, the wall including a pair of holes, each hole aligned with one of the openings of the electrical box.

11. The electrical box assembly of claim 10, wherein the wall is formed separate from the cable retainer.

12. The electrical box assembly of claim 9, wherein each second leg is oriented substantially parallel to the associated first leg, wherein the edge of the second leg and the edge of the associated first leg are spaced apart from one another.

13. The electrical box assembly of claim 9, wherein each second leg has a different length than the associated first leg.

14. The electrical box assembly of claim 9, wherein at least one of the edge of each first leg and the edge of each second leg includes a substantially V-shaped recess aligned with an axis of the associated opening, each recess engaging an outer surface of a cable and securing the cable against the rear wall of the electrical box.

15. An electrical box assembly comprising:
an electrical box including a rear wall and a side wall extending from the rear wall, the side wall and the rear wall at least partially enclosing a cavity, the side wall including at least one opening extending therethrough for receiving an electrical cable;
a cable retainer supported relative to the electrical box and positioned entirely within the cavity, the cable retainer including a first leg and a second leg, the first leg and the second leg overlying at least a portion of the opening, each of the first leg and the second leg including an edge positioned adjacent the opening for gripping an outer surface of the cable passing through the cable opening, the first leg oriented substantially parallel to the second leg such that the first leg overlaps at least a portion of the second leg, the edge of the first leg and the edge of the second leg being spaced apart from one another.

16. The electrical box assembly of claim 15, further comprising a wall secured to the electrical box and spaced apart from the first leg and the second leg, the wall including at least one hole aligned with the at least one opening of the electrical box, the hole having a dimension to allow wires from the cable to pass through while preventing an armor sheath of the cable from passing through.

17. The electrical box assembly of claim 15, wherein the wall is formed separate from the cable retainer.

18. The electrical box assembly of claim 15, wherein the first leg and the second leg have different lengths.

19. The electrical box assembly of claim 15, wherein at least one of the edge of the first leg and the edge of the second leg includes a substantially V-shaped recess aligned with an axis of the opening, the recess engaging an outer surface of the cable and securing the cable against the rear wall of the electrical box.

20. The electrical box assembly of claim 15, wherein the edge of the first leg extends toward the rear wall, the edge of the first leg being spaced apart from the rear wall by a distance less than a diameter of the cable.

\* \* \* \* \*